United States Patent
Togura

(10) Patent No.: US 9,274,154 B2
(45) Date of Patent: Mar. 1, 2016

(54) ELECTROSTATIC CAPACITANCE SENSOR AND METHOD FOR DETERMINING FAILURE OF ELECTROSTATIC CAPACITANCE SENSOR

(71) Applicant: Takeshi Togura, Sakura (JP)

(72) Inventor: Takeshi Togura, Sakura (JP)

(73) Assignee: FUJIKURA LTD., Tokyo (JP)

( * ) Notice: Subject to any disclaimer, the term of this patent is extended or adjusted under 35 U.S.C. 154(b) by 254 days.

(21) Appl. No.: 13/839,417

(22) Filed: Mar. 15, 2013

(65) Prior Publication Data

US 2013/0207677 A1    Aug. 15, 2013

Related U.S. Application Data

(63) Continuation of application No. PCT/JP2011/071825, filed on Sep. 26, 2011.

(30) Foreign Application Priority Data

Sep. 28, 2010 (JP) .................................. 2010-217316
Dec. 28, 2010 (JP) .................................. 2010-291780

(51) Int. Cl.
G01R 27/26    (2006.01)
G01R 35/00    (2006.01)
H03K 17/955   (2006.01)

(52) U.S. Cl.
CPC ............ *G01R 27/2605* (2013.01); *G01R 35/00* (2013.01); *H03K 17/955* (2013.01); *H03K 2217/960705* (2013.01); *H03K 2217/960745* (2013.01); *H03K 2217/960765* (2013.01)

(58) Field of Classification Search
CPC .. G01R 27/2605; G01R 31/028; G01R 27/26; G01R 15/16; G01R 19/2513; G06K 9/0002; G01D 5/24; G01D 5/241; G01D 5/2412; G01D 5/2417; H03K 17/955; H03K 2217/960725
USPC ........... 324/76.11–76.83, 459, 600, 649, 658, 324/669, 670, 684, 685, 720, 721, 519, 548, 324/661, 686, 500, 512, 522, 523, 527, 324/555; 702/47, 52
See application file for complete search history.

(56) References Cited

U.S. PATENT DOCUMENTS 7,196,528 B2 * 3/2007 Ebihara ................ G06K 9/0002
324/658
7,208,961 B2 * 4/2007 Miyasaka ............ G06K 9/0002
324/658

(Continued)

FOREIGN PATENT DOCUMENTS

| JP | 7-270541 A   | 10/1995 |
| JP | 2001-264448 A | 9/2001  |
| JP | 2006-242907 A | 9/2006  |
| JP | 2008-275428 A | 11/2008 |

OTHER PUBLICATIONS

International Search Report for PCT/JP2011/071825, mailing date of Dec. 13, 2011.

(Continued)

*Primary Examiner* — Huy Q Phan
*Assistant Examiner* — Raul Rios Russo
(74) *Attorney, Agent, or Firm* — Westerman, Hattori, Daniels & Adrian, LLP

(57) ABSTRACT

The disclosure has: a detection electrode (2) that detects an electrostatic capacitance; a shield electrode (3); a shield drive circuit (31) that switches between a first electric potential and a second electric potential to apply the first or second electric potential to the shield electrode; a detection circuit (21) that outputs a detection signal depending on the electrostatic capacitance detected; and a determination circuit (6) that obtains a first detection signal and a second detection signal as the basis to determine whether an abnormality of the detection electrode (2) or the shield electrode is present or absent. The first detection signal depends on the electrostatic capacitance detected when the shield drive means (31) applies the first electric potential to the shield electrode (3). The second detection signal depends on the electrostatic capacitance detected when the shield drive means (31) applies the second electric potential to the shield electrode.

22 Claims, 10 Drawing Sheets

(56) References Cited

U.S. PATENT DOCUMENTS

| | | | |
|---|---|---|---|
| 7,358,741 B2* | 4/2008 | Sato et al. | 324/457 |
| 7,583,086 B2* | 9/2009 | Yasuda | G01R 29/12 324/457 |
| 2006/0164254 A1 | 7/2006 | Kamizono et al. | |
| 2006/0250142 A1* | 11/2006 | Abe | 324/663 |
| 2007/0170925 A1* | 7/2007 | Kandori et al. | 324/457 |
| 2008/0252474 A1 | 10/2008 | Nakamura et al. | |
| 2010/0315363 A1* | 12/2010 | Kobayashi et al. | 345/173 |

OTHER PUBLICATIONS

Office Action dated Feb. 18, 2014, issued in corresponding Japanese application No. 2012-536426, w/ English translation (5 pages).

Chinese Office Action dated Jan. 7, 2015, issued in corresponding CN Patent Application No. 201180042475.1 with English translation (18 pages).

Office Action dated Sep. 18, 2015, issued in counterpart Chinese Application No. 201180042475.1. (4 pages).

* cited by examiner

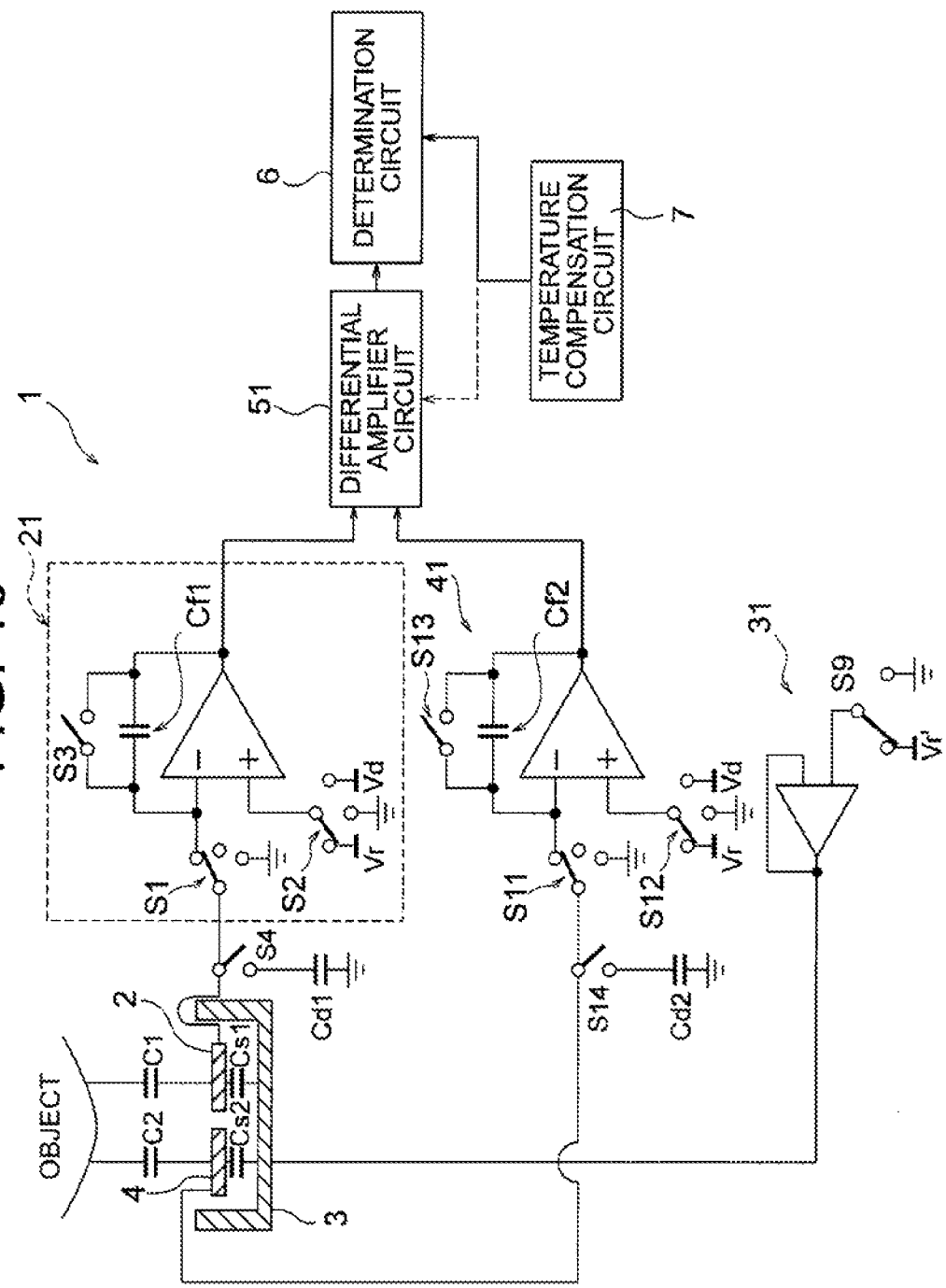

ELECTROSTATIC CAPACITANCE SENSOR AND METHOD FOR DETERMINING FAILURE OF ELECTROSTATIC CAPACITANCE SENSOR

BACKGROUND OF THE INVENTION

1. Technical Field of the Invention

The present invention relates to an electrostatic capacitance sensor and a method for determining a failure of an electrostatic-type capacitance sensor.

For those designated countries which permit the incorporation by reference, the contents described and/or illustrated in the documents relevant to Patent Application No. 2010-217316 filed with Japan Patent Office on Sep. 28, 2010 and Patent application No. 2010-291780 filed with Japan Patent Office on Dec. 28, 2010 will be incorporated herein by reference as a part of the description and/or drawings of the present application.

2. Description of the Related Art

An electrostatic capacitance detection apparatus is known which detects an object on the basis of an electrostatic capacitance between an electrode and a grounded section and which is provided with an independent auxiliary electrode that functions as a dummy object, thereby to self-diagnose a failure of the electrostatic capacitance sensor (Patent Literature 1: Published Patent Application No. 2001-264448).

PRIOR ART LITERATURE

Patent Literature

Patent Literature 1: Published Patent Application No. 2001-264448

SUMMARY OF THE INVENTION

Problems to be Solved by the Invention

If, however, an extra means for detecting a failure of an electrostatic capacitance sensor is provided like Patent Literature 1, such as an auxiliary electrode and a failure detection circuit, then a problem occurs that the number of components of the electrostatic capacitance sensor increases.

Problems to be solved by the present invention include determining whether a failure of an electrostatic capacitance sensor is present or absent without providing an extra means, such as an auxiliary electrode and a failure detection circuit, for detecting a failure of the electrostatic capacitance sensor.

Means for Solving the Problems (1) A first invention provides an electrostatic capacitance sensor thereby to solve the above problems. The electrostatic capacitance sensor comprises: a detection electrode that detects an electrostatic capacitance between the detection electrode and an object; a shield electrode that is disposed in the vicinity of the detection electrode; a shield drive means that switches between a first electric potential and a second electric potential different from the first electric potential to apply the first or second electric potential to the shield electrode; a detection means that outputs a detection signal depending on the electrostatic capacitance detected by the detection electrode; and a determination means that obtains a first detection signal and a second detection signal from the detection means as the basis to determine whether an abnormality of the detection electrode and/or the shield electrode is present or absent. The first detection signal depends on the electrostatic capacitance detected by the detection electrode when the shield drive means applies the first electric potential to the shield electrode. The second detection signal depends on the electrostatic capacitance detected by the detection electrode when the shield drive means applies the second electric potential to the shield electrode.

(2) In the above invention, the determination means may determine that an abnormality of the detection electrode and/or the shield electrode is present if a difference between the first detection signal and the second detection signal is not within a predetermined range.

(3) In the above invention, an electric potential applied to the detection electrode and the first electric potential applied to the shield electrode may be the same electric potential when the first detection signal is obtained.

(4) In the above invention, a connection between the detection electrode and the detection means may be connected via a first switch to one end of a first capacitor of which the other end may be connected to a fixed electric potential different from the first electric potential, and the determination means may compare a detection signal when the first capacitor is connected to the connection and a detection signal when the first capacitor is disconnected from the connection, and if the difference therebetween is not within a predetermined range, then the determination means may determine that the detection means is abnormal in its detection function.

(5) In the above invention, the electrostatic capacitance sensor may further comprise: a reference electrode provided to be independent from the detection electrode; and a reference electrode control means that outputs a reference signal depending on an electrostatic capacitance detected by the reference electrode, wherein the determination means may determine whether an abnormality of the detection electrode and/or the shield electrode is present or absent on the basis of the first detection signal and the second detection signal. The first detection signal may be based on a detection signal depending on the electrostatic capacitance detected by the detection electrode and the reference signal depending on the electrostatic capacitance detected by the reference electrode when the shield drive means applies the first electric potential to the shield electrode. The second detection signal may be based on a detection signal depending on the electrostatic capacitance detected by the detection electrode and the reference signal depending on the electrostatic capacitance detected by the reference electrode when the shield drive means applies the second electric potential different from the first electric potential to the shield electrode.

(6) In the above invention, a connection between the reference electrode and the reference electrode control means may be connected via a second switch to one end of a second capacitor of which the other end may be connected to a fixed electric potential different from the first electric potential, and the determination means may determine that the detection means is abnormal in its detection function if a difference between a detection signal when the second switch connects the second capacitor to the connection between the reference electrode and the reference electrode control means and a detection signal when the second switch disconnects the second capacitor from the connection is not within a predetermined range.

(7) In the above invention, the electrostatic capacitance sensor may further comprise a temperature compensation means that has a function for detecting a temperature in the vicinity of the detection electrode or the detection means as the basis to correct the first detection signal and/or the second detection signal. The temperature compensation means may also have a function for detecting a temperature in the vicinity of the reference electrode or the reference electrode control means as the basis to correct the first detection signal and/or the second detection signal.

(8) In the above invention, the second electric potential may be within a range of 80% to 120% of the first electric potential.

(9) Another aspect of the present invention provides a method for determining a failure of an electrostatic capacitance sensor thereby to solve the above problems. The method comprises the steps of: detecting a first detection signal depending on an electrostatic capacitance detected by a detection electrode when a first electric potential is applied to a shield electrode provided in the vicinity of the detection electrode; detecting a second detection signal depending on an electrostatic capacitance detected by the detection electrode when a second electric potential different from the first electric potential is applied to the shield electrode; and determining whether an abnormality of the detection electrode is present or absent on the basis of the first detection signal and the second detection signal.

(10) In the above invention, the method for determining a failure of an electrostatic capacitance sensor may further comprise the steps of: connecting via a first switch a connection between the detection electrode and an output section for a detection signal depending on the electrostatic capacitance detected by the detection electrode to one end of a first capacitor of which the other end is connected to a fixed electric potential different from the first electric potential; and determining that a function for detecting the detection signal is abnormal if a difference between a detection signal when the first switch connects the first capacitor to the connection and a detection signal when the first switch disconnects the first capacitor from the connection is not within a predetermined range.

(11) A second invention provides an electrostatic capacitance sensor thereby to solve the above problems. The electrostatic capacitance sensor comprises: a detection electrode that detects an electrostatic capacitance between the detection electrode and an object; a shield electrode that is disposed in the vicinity of the detection electrode; a detection electrode control means that switches between a first electric potential and a second electric potential different from the first electric potential to apply the first or second electric potential to the detection electrode and outputs a detection signal depending on the electrostatic capacitance detected by the detection electrode; and a determination means that determines whether an abnormality of the detection electrode and/or the shield electrode is present or absent on the basis of a first detection signal depending on the electrostatic capacitance detected by the detection electrode when the detection electrode control means applies the first electric potential to the detection electrode and a second detection signal depending on the electrostatic capacitance detected by the detection electrode when the detection electrode control means applies the second electric potential to the detection electrode.

(12) In the above invention, the determination means may determine that an abnormality of the detection electrode and/or the shield electrode is present if a difference between values of the first detection signal and the second detection signal is not within a predetermined range.

(13) In the above invention, the first electric potential applied to the detection electrode may be the same electric potential as an electric potential applied to the shield electrode when the first detection signal is obtained.

(14) In the above invention, a connection between the detection electrode and the detection electrode control means may be connected via a first switch to one end of a first capacitor of which the other end is connected to a fixed electric potential different from the first electric potential, and the determination means may determine that the detection electrode control means is abnormal in its detection function if a difference between a detection signal when the first capacitor is connected to the connection and a detection signal when the first capacitor is disconnected from the connection is not within a predetermined range.

(15) In the above invention, the electrostatic capacitance sensor may further comprise: a reference electrode provided to be independent from the detection electrode; and a reference electrode control means that outputs a reference signal depending on an electrostatic capacitance detected by the reference electrode, wherein the determination means may determine whether an abnormality of the detection electrode and/or the shield electrode is present or absent on the basis of the first detection signal and the second detection signal. The first detection signal may be obtained on the basis of a detection signal depending on the electrostatic capacitance detected by the detection electrode and the reference signal depending on the electrostatic capacitance detected by the reference electrode when the detection electrode control means applies the first electric potential to the detection electrode. The second detection signal may be obtained on the basis of a detection signal depending on the electrostatic capacitance detected by the detection electrode and the reference signal depending on the electrostatic capacitance detected by the reference electrode when the detection electrode control means applies the second electric potential different from the first electric potential to the detection electrode.

(16) In the above invention, a connection between the reference electrode and the reference electrode control means may be connected via a second switch to one end of a second capacitor of which the other end is connected to a fixed electric potential different from the first electric potential, and the determination means may determine that the detection electrode control means is abnormal in its detection function if a difference between a detection signal when the second switch connects the second capacitor to the connection between the reference electrode and the reference electrode control means and a detection signal when the second switch disconnects the second capacitor from the connection is not within a predetermined range.

(17) In the above invention, the electrostatic capacitance sensor may be configured to further comprise a temperature compensation means that has a function for detecting a temperature in the vicinity of the detection electrode or the detection electrode control means as the basis to correct the first detection signal and/or the second detection signal. In addition, the temperature compensation means may also have a function for detecting a temperature in the vicinity of the reference electrode or the reference electrode control means as the basis to correct the first detection signal and/or the second detection signal.

(18) In the above invention, the second electric potential may be within a range of 80% to 120% of the first electric potential.

(19) Another aspect of the present invention provides a method for determining a failure of an electrostatic capacitance sensor thereby to solve the above problems. The method comprises the steps of: detecting a first detection signal depending on an electrostatic capacitance detected by a detection electrode when a first electric potential is applied to the detection electrode; detecting a second detection signal depending on an electrostatic capacitance detected by the detection electrode when a second electric potential different from the first electric potential is applied to the detection electrode; and determining whether an abnormality of the detection electrode is present or absent on the basis of the first detection signal and the second detection signal.

(20) In the above invention, the method may further comprise the steps of: connecting via a first switch a connection between the detection electrode and an output section for a detection signal depending on the electrostatic capacitance detected by the detection electrode to one end of a first capacitor of which the other end is connected to a fixed electric potential different from the first electric potential; and determining that a function for detecting the detection signal is abnormal if a difference between a detection signal when the first switch connects the first capacitor to the connection and a detection signal when the first switch disconnects the first capacitor from the connection is not within a predetermined range.

Advantageous Effect of the Invention

According to the above first invention, whether an abnormality of the detection electrode or the shield electrode is present or absent is determined on the basis of the first detection signal depending on the electrostatic capacitance detected by the detection electrode when the first electric potential is applied to the shield electrode and the second detection signal depending on the electrostatic capacitance detected by the detection electrode when the second electric potential is applied to the shield electrode, and a failure of the detection electrode and/can thus be detected without providing any extra means and step.

According to the above second invention, whether an abnormality of the detection electrode and/or the shield electrode is present or absent is determined on the basis of the first detection signal depending on the electrostatic capacitance detected when the first electric potential is applied to the detection electrode and the second detection signal depending on the electrostatic capacitance detected when the second electric potential is applied to the detection electrode, and a failure of the electrostatic capacitance sensor can thus be detected without providing any extra means and step.

BRIEF DESCRIPTION OF DRAWINGS

FIG. 10 is a schematic diagram of an electrostatic capacitance sensor according to a second embodiment of the second invention.

DESCRIPTION OF THE PREFERRED EMBODIMENT

First Embodiment of the First Invention

An electrostatic capacitance sensor 1 according to a first embodiment of the first invention will hereinafter be described with reference to the drawings, wherein the electrostatic capacitance sensor 1 detects presence or absence and proximity of an object, such as human and a material object, and can self-diagnose a failure of the electrostatic capacitance sensor, such as electrode abnormality and circuit abnormality.

Figure 1:
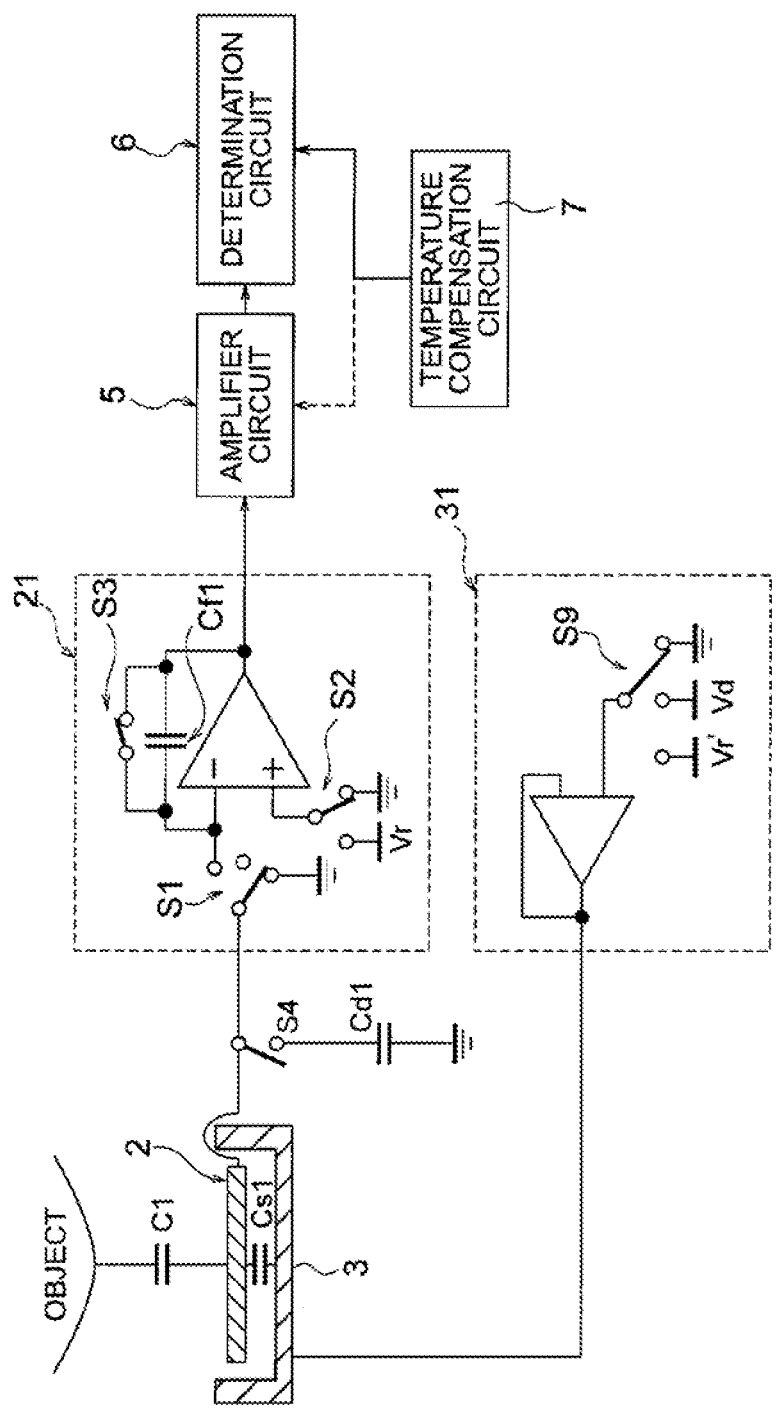
FIG. 1 is a schematic diagram illustrating the configuration of an electrostatic capacitance sensor according to a first embodiment of the first invention.

FIG. 1 is a diagram illustrating a configuration of the electrostatic capacitance sensor 1.

As shown in FIG. 1, the electrostatic capacitance sensor 1 according to the embodiment of the present invention comprises: a detection electrode 2; a detection circuit 21; a shield electrode 3 that is provided in the vicinity of the detection electrode 2; a shield drive circuit 31; an amplifier circuit 5 that amplifies a detection signal detected by the detection circuit 21; and a determination circuit 6 that determines an object detection result and a self-diagnosis result of the electrostatic capacitance sensor 1 on the basis of one or more values of the obtained detection signal.

In addition, a connection between the detection electrode 2 and the detection circuit 21 is connected via a first switch S4 to one end of a first capacitor Cd1 of which the other end is connected to a fixed electric potential, such as ground, which has a different electric potential from a first electric potential.

The detection electrode 2 in the present embodiment is a plate-like conductor, and detects an electrostatic capacitance between the detection electrode 2 and an object when the detection circuit 21 applies a predetermined electric potential (Vr) to the detection electrode 2. Note that the shape of the electrode is not limited to plate-like and may be rod-like or other three-dimensional shape.

The shield electrode 3 is provided in the vicinity of the detection electrode 2. The shield electrode 3 in the present embodiment surrounds the detection electrode 2 with the exception of a detection surface of the detection electrode 2 (upper surface of the detection electrode comprised of the plate-like conductor). This allows for detecting with high sensitivity whether an object to be detected (referred simply to as "object") is present or absent within a predetermined region at the detecting surface side of the detection electrode 2 (referred hereinafter to as "detection region") and/or a distance to the object.

The shield drive circuit 31 involves a function that switches predetermined voltages to apply them to the shield electrode 3. The shield drive circuit 31 in the present embodiment applies a first electric potential (Vr') to the shield electrode 3 and can switches to a second electric potential (Vd) different from the first electric potential to apply it to the shield electrode 3. The first electric potential (Vr') may be or may not be the same electric potential as an electric potential (Vr) to be applied to the detection electrode 2.

The detection circuit 21 in the present embodiment detects a first detection signal depending on the electrostatic capacitance detected by the detection electrode 2 when the shield drive circuit 31 applies the first electric potential (Vr') to the shield electrode 3, and also detects a second detection signal depending on the electrostatic capacitance detected by the detection electrode 2 when the shield drive circuit 31 applies the second electric potential (Vd) to the shield electrode 3. The detection circuit 21 transmits the detected signals to the amplifier circuit 5 as will be described later.

Note that, when the first electric potential (Vr') applied to the shield electrode 3 is the same electric potential as the predetermined electric potential (Vr) applied to the detection electrode, an electrostatic capacitance (Cs1) between the detection electrode 2 and the shield electrode 3 is not detected, while the detection circuit 21 detects a detection signal depending on an electrostatic capacitance (C1), which is detected by the detection electrode 2, between the detection electrode 2 and an object that is present within the detection region.

The second electric potential (Vd) may be, but not limited to, within a range of 80% to 120% of the first electric potential. If the range of the electric potential to be applied is within a range of −20% to +20% relative to the first electric potential, then the first detection signal depending on the electrostatic capacitance when the first electric potential is applied and the second detection signal depending on the electrostatic capacitance when the second electric potential is applied can fall within a dynamic range, and failure diagnosis for the electrostatic capacitance sensor can thus be accurately performed.

In addition, the electrostatic capacitance sensor 1 according to the present embodiment comprises a temperature compensation circuit 7 that has a temperature compensation function for correcting the first detection signal and/or the second detection signal on the basis of the temperature in the vicinity of the detection electrode 2 or the detection circuit 21. This temperature compensation circuit 7 may be configured as an independent circuit from the amplifier circuit 5 and the determination circuit 6, or may also be configured to be included in the amplifier circuit 5 or the determination circuit 6. The temperature compensation circuit 7 may employ a common means, such as a means that utilizes the temperature characteristic of electric potential in forward direction associated with a diode element. This allows for eliminating the influence of temperatures on the detection result (measurement value).

Moreover, according to the present embodiment, the connection between the detection electrode 2 and the detection circuit 21 is connected via the first switch S4 to one end of the first capacitor Cd1 of which the other end is connected to a fixed electric potential that has a different electric potential from the first electric potential, so that the detection signal output from the detection circuit 21 changes depending on the ON/OFF state of the first switch. That is, if the detection circuit 21 is normal, then the detection signal changes depending on the first capacitor Cd1 when the first switch S4 is switched from OFF to ON.

Here, the first switch S4 is a switch that controls whether or not to connect the one end of the first capacitor Cd1, of which the other end is connected to a fixed electric potential that has a different electric potential from the first fixed electric potential, to the connection between the detection electrode and the detection circuit.

The amplifier circuit 5 amplifies the detection signal obtained by the detection circuit 21. This amplifier circuit 5 may comprise a band-pass filter for removing noise components and a low-pass filter for removing ripple components.

Further, the amplifier circuit 5 transmits the detection signal depending on the electrostatic capacitance detected by the detection electrode 2 to the determination circuit 6 as will be described later.

The determination circuit 6 in the present embodiment involves three functionalities below.

The first functionality is associated with a function for determining whether an object is present or absent within the detection region and a function for determining a distance from the object, on the basis of the detection signal depending on the detected electrostatic capacitance between the object and the detection electrode. The second functionality is a function for determining whether an electrode abnormality of the detection electrode 2 and/or the shield electrode 3 is present or absent. The third functionality is a function for determining whether an abnormality in detection function of the detection circuit 21 is present or absent.

Each functionality of the determination circuit 6 in the electrostatic capacitance sensor 1 according to the present embodiment will be overviewed.

First, the determination circuit 6 determines whether an object is present or absent within the detection region and/or a distance to the object on the basis of the first detection signal depending on the electrostatic capacitance detected when the first electric potential is applied to the shield electrode 3. In this operation, the electric potential applied to the detection electrode 2 may be the same value as that of the first electric potential applied to the shield electrode 3.

Specifically, the determination circuit 6 determines that an object is present within the detection region if the value of the first detection signal obtained from the amplifier circuit 5 is a predetermined value or more.

In addition, the determination circuit 6 calculates the distance between the detection electrode 2 and the object on the basis of the value of the first detection signal obtained from the amplifier circuit 5. Methods for determining whether an object is present or absent within the detection region and the distance to the object are not particularly limited, and any method known at the time of filing this application may appropriately be used.

Second, the determination circuit 6 determines whether an abnormality of the detection electrode 2 or the shield electrode 3 is present or absent, such as breakage, crack, distortion, curvature and other electrode abnormalities of the detection electrode 2 or the shield electrode 3, on the basis of the first detection signal depending on the electrostatic capacitance detected when the first electric potential is applied to the shield electrode 3 and the second detection signal depending on the electrostatic capacitance detected when the second electric potential is applied to the shield electrode 3.

Specifically, the determination circuit 6 compares values of the first detection signal and the second detection signal to obtain the difference (change amount) therebetween, and determines that an abnormality is present in the detection electrode 2 and/or the shield electrode 3 if the difference is not within a predetermined range.

Third, the determination circuit 6 in the present embodiment compares a detection signal when the first capacitor Cd1 is connected to the connection between the detection electrode 2 and the detection circuit 21 and a detection signal when the first capacitor Cd1 is not connected thereby to obtain the difference (change amount) therebetween, and determines that an abnormality is present in the detection function of the detection circuit 21 if the difference is not within a predetermined range.

Thus, the electrostatic capacitance sensor 1 according to the present embodiment has three functional modes: a measurement mode for perceiving presence or absence of an object and measuring the distance to the object; an electrode check mode for detecting an electrode abnormality, such as crack, breakage, distortion and curvature, of the detection electrode 2 and/or the shield electrode 3; and a circuit check mode for detecting an abnormality of the detection circuit 21, which detects the electrostatic capacitance associated with the detection electrode 2. In the present example, the electrostatic capacitance sensor 1 that involves all of the above functionalities is exemplified for explanation, but the functionality for the circuit check mode may be omitted.

Each control procedure for normal measurement mode A, electrode check mode B and circuit check mode C for the detection circuit will hereinafter be described with reference to FIGS. 2 to 4.

Figure 2:
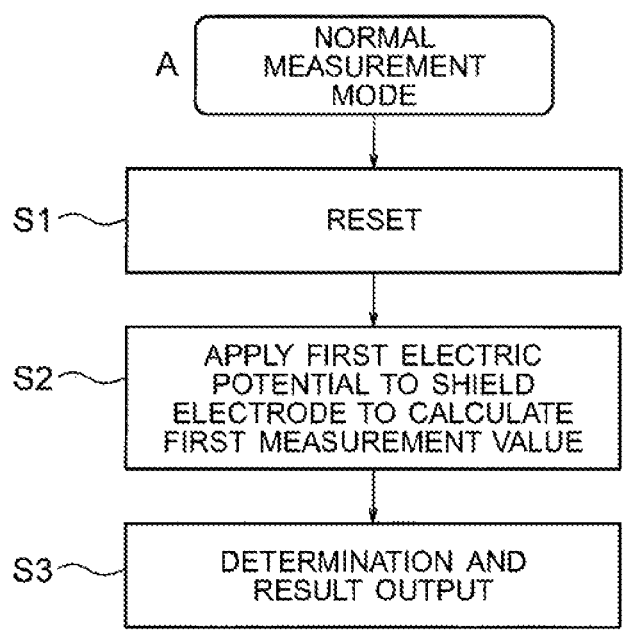
FIG. 2 is a flowchart illustrating a control procedure in a normal measurement mode of the electrostatic capacitance sensor shown in FIG. 1.

FIG. 2 is a flowchart for the normal measurement mode A of the electrostatic capacitance sensor 1 according to the present embodiment.

At step S1 of the flowchart shown in FIG. 2, the electrostatic capacitance sensor 1 discharges the electric charge stored in the detection circuit 21 for the initialization (reset).

Specifically, switches S1 to S3 in the detection circuit 21 of the electrostatic capacitance sensor 1 shown in FIG. 1 are switched so that the switch S1 connects the detection electrode 2 to the ground, the switch S2 connects the (+) input side of the operational amplifier in the detection circuit to the ground, and the switch S3 is turned on to short-circuit the capacitor Cf1. This allows the electric charge stored in the detection circuit 21 to be discharged. During this operation, the shield electrode 3 is connected to the ground by switch S9 in the shield drive circuit 31. In addition, the first switch S4 is turned off, so that the first capacitor Cd1 is not connected to the connection between the detection electrode 2 and the detection circuit 21.

Next at step S2, the predetermined electric potential (Vr) is applied to the detection electrode 2 while the first electric potential (Vr') is applied to the shield electrode 3, and a first measurement value (first detection signal) is calculated depending on the electrostatic capacitance detected by the detection electrode 2.

Specifically, the switch S9 in the shield drive circuit 31 of the electrostatic capacitance sensor 1 shown in FIG. 1 is switched to connect the shield electrode 3 to the first electric potential (Vr'), while the switches S1 to S3 in the detection circuit 21 are switched so that the switch s1 connects the detection electrode 2 to the (−) input side of the operational amplifier, the switch S2 connects the (+) input side of the operational amplifier to the predetermined electric potential (Vr), and the switch S3 opens the capacitor Cf1 to charge the capacitor Cf1 with an electric charge of Qf1=Vr×C1+(Vr−Vr')−Cs1. Thereafter, the switch S1 opens the detection electrode 2 while the switch S2 connects the (+) input side of the operational amplifier to the ground, and the first measurement value is thereby calculated as an electric potential of V=(Vr×C1+(Vr−Vr')×Cs1)/Cf1.

Note that the first electric potential (Vr') applied to the shield electrode 3 may be made to be the same electric potential as the electric potential (Vr) applied to the detection electrode 2 thereby causing the electrostatic capacitance (Cs1) between the detection electrode 2 and the shield electrode 3 not to be detected, and the measurement value (electric potential V=Vr×(C1/Cf1)) can be obtained depending on the electrostatic capacitance between the detection electrode 2 and an object.

Further at step S3, the determination circuit 6 uses the value of the first detection signal as the basis to determine whether an object (object to be detected) is present or not within the detection region detectable by the detection electrode 2 and to obtain the distance between the detection electrode 2 and the object (the detected object). According to the above procedure, the process of the measurement mode A is performed for perceiving the presence of an object and measuring the distance to the object.

The process of the electrode check mode B for the electrostatic capacitance sensor 1 according to the present embodiment will then be described with reference to FIG. 3.

Figure 3:
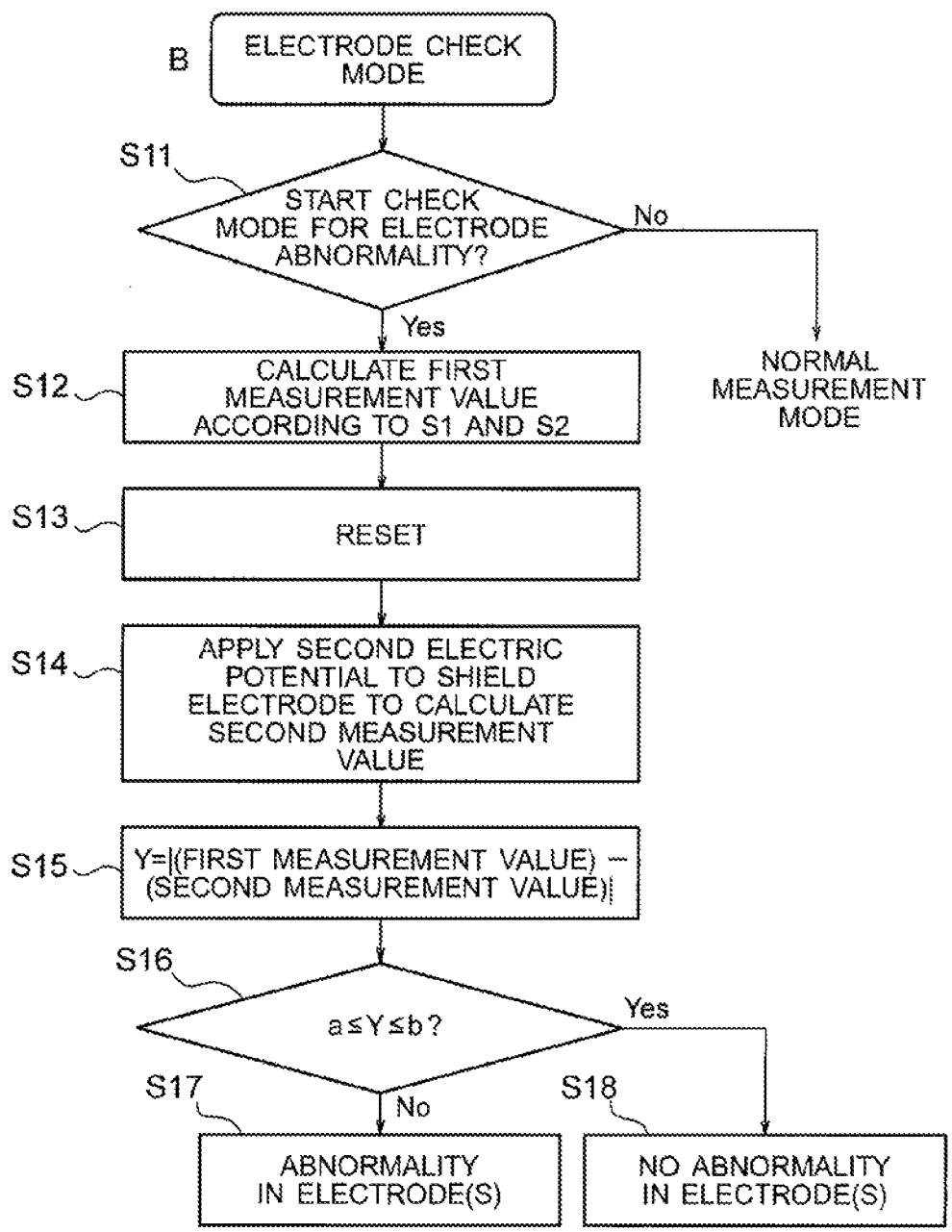
FIG. 3 is a flowchart associated with an electrode check mode of the electrostatic capacitance sensor shown in FIG. 1.
Figure 4:
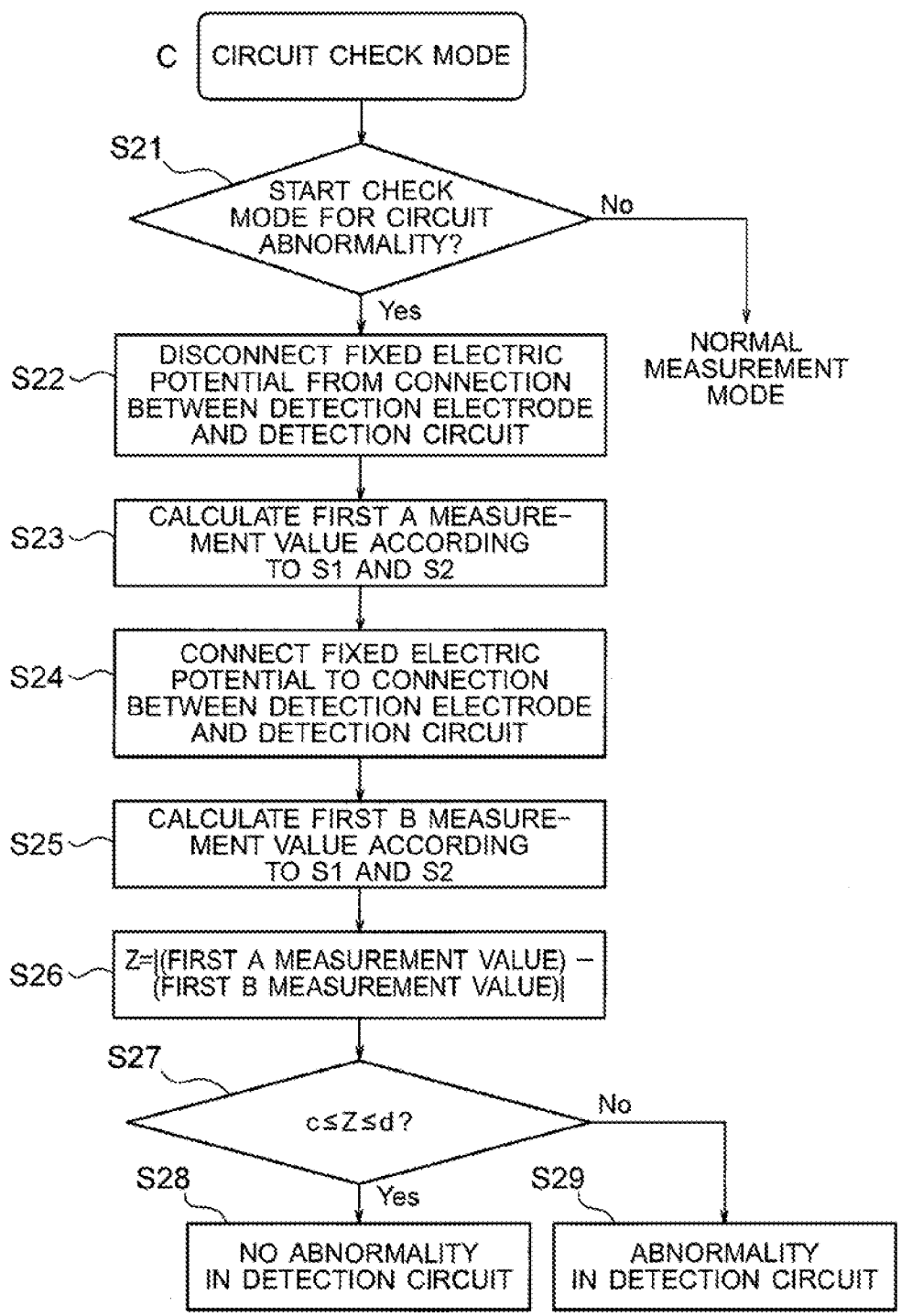
FIG. 4 is a flowchart illustrating a control procedure in a circuit check mode of the electrostatic capacitance sensor shown in FIG. 1.

At step S11 of FIG. 3, the determination circuit 6 waits for the process start timing of the electrode check mode B while processing the normal measurement mode A. The electrode check mode B may be performed with a predetermined period or at a predetermined timing such as when the process is completed or started, or otherwise be performed if a predetermined condition is satisfied such as when variation in the output value is observed.

At step S12, the above-described steps S1 to S2 shown in FIG. 2 are performed to obtain the first measurement value (first detection signal) because the determination of an electrode abnormality is performed through the comparison with the normal measurement value. In the present process, the first measurement value (first detection signal) that has been previously output may also be read out.

Subsequently at step S13, the electrostatic capacitance sensor 1 performs the above-described step S1 shown in FIG. 2 to switch the switches S1 to S3 in the detection circuit 21 of the electrostatic capacitance sensor 1 shown in FIG. 1 thereby discharging the electric charge stored in the detection circuit 21 for the initialization (reset).

At step S14 which is performed after or before step S13, the shield drive circuit 31 applies a second electric potential that is different from the first electric potential to the shield electrode 3. Further, like the above-described step S2 shown in FIG. 2, the switches S1 to S3 in the detection circuit 21 of the electrostatic capacitance sensor 1 shown in FIG. 1 are switched, and a second measurement value (second detection signal) is thereby calculated depending on the electrostatic capacitance detected by the detection electrode 2 when the second electric potential is applied to the shield electrode 3.

At steps S15 and S16, the determination circuit 6 determines an abnormality of the detection electrode and/or the shield electrode on the basis of the first measurement value and the second measurement value (the first detection signal and the second detection signal). Specifically at step S15, the determination circuit 6 calculates a difference (change amount) Y between the first measurement value and the second measurement value. Then at step S16, the determination circuit 6 determines whether the difference Y between the first measurement value and the second measurement value is within a predetermined range (a≤Y≤b) or not.

The electrostatic capacitance (Cs1) between the detection electrode 2 and the shield electrode 3 depends on areas of the detection electrode and the shield electrode and the distance therebetween. As such, whether or not the change amount of the electrostatic capacitance (Cs1) between the detection electrode 2 and the shield electrode 3 caused by switching the electric potential applied to the shield electrode 3 is within a predetermined certain range may be used as the basis to determine whether or not an electrode abnormality, such as breakage, wire breaking, curvature or distortion, occurs in the detection electrode 2 or the shield electrode 3. That is, if the difference (change amount) between the first measurement value and the second measurement value is not within the predetermined range, then it can be determined that an electrode abnormality, such as breakage, wire breaking, curvature or distortion, occurs in the detection electrode 2 or the shield electrode 3.

The electrostatic capacitance sensor 1 according to the present embodiment preliminarily sets the range (a≤Y≤b) of the change amount of the electrostatic capacitance (Cs1) between the detection electrode 2 and the shield electrode 3, which is caused by switching the electric potential applied to the shield electrode 3 when an electrode abnormality does not occur, and determines whether or not the difference Y is within the predetermined range. If the difference Y is not within the predetermined range, then the process proceeds to step S17 and the determination circuit 6 determines that an abnormality is present in the detection electrode 2 or the shield electrode 3. If, on the other hand, the difference Y is within the predetermined range, then the process proceeds to step S18 and the determination circuit 6 determines that no abnormality is present in the detection electrode 2 and shield electrode 3.

Thus, the electrostatic capacitance sensor 1 according to the present embodiment switches and provides two different electric potentials Vr' and Vd to the shield electrode 3 thereby to obtain the first measurement value and the second measurement value (the first detection signal and the second detection signal), and compares them to detect an electrode abnormality of the electrostatic capacitance sensor 1. Therefore, an electrode abnormality can be detected with a high degree of accuracy because, taking into consideration the electrostatic capacitance (Cs1) between the detection electrode 2 and the shield electrode 3 provided in the vicinity of the detection electrode 2, an electrode abnormality is detected using the change in the electrostatic capacitance when two different electric potentials are applied to the shield electrode 3 provided in the vicinity of the detection electrode 2.

Finally, the circuit check mode C for the detection circuit of the electrostatic capacitance sensor 1 according to the present embodiment will be described with reference to FIG. 4.

At step S21, the determination circuit 6 waits for the start timing of the circuit check mode C. Like the process at step S11 in the above-described electrode check mode B, the determination circuit 6 performs the circuit check mode C with a predetermined period or at a predetermined timing, or otherwise if a predetermined condition is satisfied.

At step S22, the connection between the detection electrode 2 and the detection circuit 21 is disconnected from the fixed electric potential, followed by step S23 where the first detection signal (first A measurement value) is obtained. In other words, the steps S1 to S2 shown in FIG. 2 are performed in the state where the first switch S4 is turned off, which is connected to the connection between the detection electrode 2 and the detection circuit 21 of the electrostatic capacitance sensor 1 shown in FIG. 1.

At the subsequent step S24, the first switch S4 is turned on to connect one end of the first capacitor Cd1 to the connection between the detection electrode 2 and the detection circuit 21. The other end of the first capacitor Cd1 is connected to an electric potential which is different from the first electric potential and which may be the ground electric potential or otherwise be set as being a certain electric potential.

At the subsequent step S25, the determination circuit 6 obtains the first detection signal (first B measurement value) when the switch S4 is turned on.

Further at step S26, the determination circuit 6 calculates a difference Z between the first detection signals (between the first A measurement value and the first B measurement value).

Thereafter at step S27, the determination circuit 6 determines whether the difference Z is within a predetermined range (c≤Z≤d) or not.

If the detection circuit 21 for electrostatic capacitance detection is normal, then there occurs a change between the detection signal (first B measurement value) obtained when the fixed electric potential is connected via the first capacitor Cd1 to the connection between the detection electrode 2 and the detection circuit 21 and the detection signal (first A measurement value) obtained when the fixed electric potential is not connected, and the change depends on the connected fixed electric potential. That is, if the difference Z between the first A measurement value and the first B measurement value is not within a range that depends on the connected fixed electric potential, then the detection circuit 21 is presumed to have a failure.

Therefore, in the determination at step S27, if the difference Z is within the predetermined range, then the detection circuit is determined to be normal (step S28), while on the other hand, if the difference Z is not within the predetermined range, then the detection circuit is determined to be abnormal (step S29).

Second Embodiment of the First Invention

An electrostatic capacitance sensor according to a second embodiment of the first invention is further provided with a reference electrode 4 and a reference electrode control circuit 41 in addition to the electrostatic capacitance sensor according to the first embodiment of the first invention, and a differential amplifier circuit 5 substituted for the amplifier circuit.

The second embodiment will hereinafter be described with reference to FIG. 5.

Figure 5:
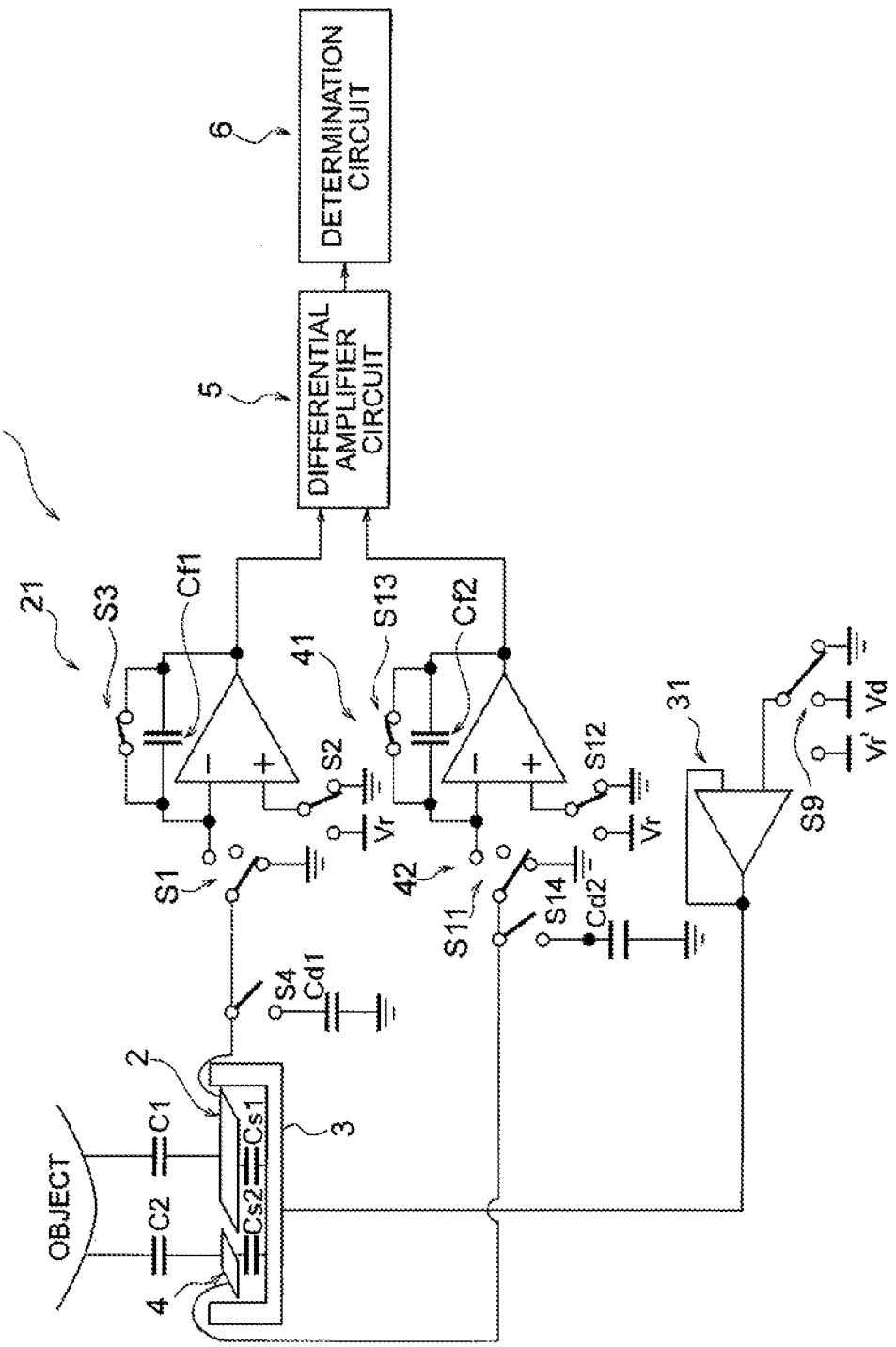
FIG. 5 is a schematic diagram illustrating an electrostatic capacitance sensor according to a second embodiment of the first invention.

As shown in FIG. 5, the electrostatic capacitance sensor 1 according to the second embodiment of the present invention comprises: a detection electrode 2; a detection circuit 21; a shield electrode 3 that is provided in the vicinity of the detection electrode 2; a shield drive circuit 31; the reference electrode 4; the reference electrode control circuit 41; the differential amplifier circuit 5 that amplifies a difference between a detection signal detected by the detection circuit 21 and a detection signal detected by the reference electrode control circuit 41; and a determination circuit 6 that determines an object detection result and a self-diagnosis result of the electrostatic capacitance sensor 1 on the basis of values of the obtained detection signals.

In addition, a connection between the detection electrode 2 and the detection circuit 21 is connected via a first switch S4 to a first capacitor Cd1 while a connection between the reference electrode 4 and the reference electrode control circuit 41 is connected via a second switch S14 to a second capacitor Cd2.

The detection electrode 2, the detection circuit 21, the shield electrode 3, the shield drive circuit 31, the determination circuit 6 and the first switch S4 in the second embodiment involve the same functionalities as those of respective configurations in the above-described first embodiment. In order to avoid redundant explanation herein, the description will be made to be assisted by the explanation for the common configurations and functionalities with the electrostatic capacitance sensor 1 according to the first embodiment.

The reference electrode 4 in the present embodiment is a plate-like conductor (the figure shows it in a perspective view for convenience). This reference electrode 4 is configured to be able to detect an electrostatic capacitance of the surrounding environment of the detection electrode 2 at the time of detection without being affected by an object to be detected, such as through being formed sufficiently smaller than the detection electrode 2, being surrounded in its entire perimeter by the shield electrode 3, and being disposed at a location where the object to be detected does not exist. Note that the shape of the reference electrode is not limited to plate-like and may be rod-like or other three-dimensional shape.

The reference electrode control circuit 41 detects a reference signal depending on an electrostatic capacitance when a predetermined electric potential is applied to the reference electrode 4. This electrostatic capacitance detected by the reference electrode 4 is subtracted from the electrostatic capacitance detected by the detection electrode 2, and an electrostatic capacitance can thus be detected in consideration of the influence from the environment at the time of detection. Although not particularly limited, it is preferred that the electric potential applied to the detection electrode 2 and the electric potential applied to the reference electrode are the same. Note that the reference electrode 4 and the reference electrode control circuit 41 may not be grounded. The reference electrode control circuit 41 transmits the detected signal to the differential amplifier circuit 5 as will be described later.

The differential amplifier circuit 5 in the present embodiment, which comprises one or more inverting amplifiers of operational amplifiers, has a functionality that subtracts a value of the detection signal detected by the reference electrode control circuit 41 from a value of the detection signal detected by the detection circuit 21 thereby to obtain a detection signal depending on the electrostatic capacitance between the detection electrode 2 and an object without being affected by the environment. This differential amplifier circuit 5 may comprise a filter for removing noise components. Further, the differential amplifier circuit 5 transmits the detection signal depending on the electrostatic capacitance between the detection electrode 2 and the object to the determination circuit 6 as will be described later.

The differential amplifier circuit 5 in the present embodiment also takes into consideration the detection signal depending on the electrostatic capacitance detected by the reference electrode 4 when obtaining each of the above-described first measurement value and second measurement value (the first detection signal and the second detection signal). Specifically, at the time of obtaining the first measurement value (first detection signal), the differential amplifier circuit 5 subtracts, from the electrostatic capacitance detected by the detection electrode 2 when the first electric potential is applied to the shield electrode 3, the electrostatic capacitance detected by the reference electrode 4 at the same timing, thereby to obtain the first measurement value (first detection signal) in which the influence from the environment is eliminated.

Similarly, at the time of obtaining the second detection signal, the differential amplifier circuit 5 subtracts, from the electrostatic capacitance detected by the detection electrode 2 when the second electric potential is applied to the shield electrode 3, the electrostatic capacitance detected by the reference electrode 4 at the same timing, thereby to obtain the second measurement value (second detection signal) in which the influence from the environment is eliminated. The differential amplifier circuit 5 transmits these values to the determination circuit 6.

When the above-described first A measurement value and first B measurement value (the first A detection signal and the first B detection signal) are each obtained, the detection signal depending on the electrostatic capacitance detected by the reference electrode 4 is also taken into consideration. Specifically, at the time of obtaining the first A detection signal, the differential amplifier circuit 5 subtracts, from the electrostatic capacitance detected by the detection electrode 2 when the first switch S4 does not connect the first capacitor Cd1 to the connection between the detection electrode and the detection circuit, the electrostatic capacitance detected at the same timing by the reference electrode 4 when the second switch S14 does not connect the second capacitor Cd2 to the connection between the reference electrode and the reference electrode control circuit, thereby to obtain the first A measurement value (detection signal) in which the influence from the environment is eliminated.

Similarly, at the time of obtaining the first B measurement value (detection signal), the differential amplifier circuit 5 subtracts, from the electrostatic capacitance detected by the detection electrode 2 when the first switch S4 does connect the first capacitor Cd1 to the connection between the detection electrode and the detection circuit, the electrostatic capacitance detected at the same timing by the reference electrode 4 when the second switch S14 does connect the second capacitor Cd2 to the connection between the reference electrode and the reference electrode control circuit, thereby to obtain the first B measurement value (detection signal) in which the influence from the environment is eliminated. The differential amplifier circuit 5 transmits these values to the determination circuit 6.

The determination circuit 6 can determine that an object is present within a predetermined detection region if the first measurement value (the value of the first detection signal) depending on the electrostatic capacitance obtained from the differential amplifier circuit 5 is a predetermined value or more. In addition, the determination circuit 6 uses the value of the first detection signal as the basis to obtain a distance to a human body with reference to correspondence information which associates the first measurement value (the value of the first detection signal) with a distance to a human body (object). According to the above process, the process of a measurement mode A is performed for perceiving the presence of an object and measuring the distance to the object like the first embodiment.

In addition, the determination circuit 6 obtains the first measurement value and the second measurement value (the first detection signal and the second detection signal) depending on the electrostatic capacitances from the differential amplifier circuit 5 as the basis to perform a check mode B associated with the determination for an electrode abnormality of the detection electrode, the reference electrode and the shield electrode like the check mode for an electrode abnormality in the first embodiment.

Further, the determination circuit 6 obtains the first A measurement value and the first B measurement value (the first A detection signal and the first B detection signal) depending on the electrostatic capacitances from the differential amplifier circuit 5 as the basis to perform a circuit check mode C associated with the determination for a circuit abnormality of the reference electrode control circuit like the check mode for the detection circuit in the first embodiment.

Thus, the electrostatic capacitance sensor 1 according to the present embodiment switches and provides two different electric potentials Vr' and Vd to the shield electrode 3 thereby to obtain the first detection signal and the second detection signal, and uses the difference therebetween as the basis to detect an abnormality, such as crack or breakage, of the detection electrode and/or the shield electrode 3. Therefore, an abnormality of electrodes can be detected without providing any extra electrode and circuit.

Note that the electrostatic capacitance sensor 1 according to the second embodiment may also be provided with a temperature compensation circuit 7 that has a temperature compensation function for correcting the first detection signal and/or the second detection signal on the basis of the temperature in the vicinity of the detection electrode 2 or the detection circuit 21 or the temperature in the vicinity of the reference electrode 4 or the reference electrode control circuit 41. This temperature compensation circuit 7 may be configured as an independent circuit from the differential amplifier circuit 5 and the determination circuit 6, or may also be configured to be included in the differential amplifier circuit 5 or the determination circuit 6.

The embodiments heretofore explained are described to facilitate understanding of the present invention and are not described to limit the present invention. Therefore, it is intended that the elements disclosed in the above embodiments include all design changes and equivalents to fall within the technical scope of the present invention.

In the present embodiment, as one example of the electrostatic capacitance sensor according to the present invention that comprises a detection electrode, a detection means, a shield electrode, a shield drive means and a determination means, the electrostatic capacitance sensor 1 has been described which comprises the detection electrode 2, the detection circuit 21, the shield electrode 3, the shield drive circuit 31, the differential amplifier circuit 5 and the determination circuit 6, but the present invention is not limited thereto. Although the present embodiment has been described for an example in which the determination means is configured as a circuit for determining whether an abnormality of the detection electrode and/or the shield electrode is present or absent, the determination means may also be configured as software.

First Embodiment of the Second Invention

An electrostatic capacitance sensor 1 according to a first embodiment of the second invention will hereinafter be described with reference to the drawings, wherein the electrostatic capacitance sensor 1 detects presence or absence and proximity of an object, such as human and a material object, and can self-diagnose a failure of the electrostatic capacitance sensor, such as electrode abnormality and circuit abnormality.

Figure 6:
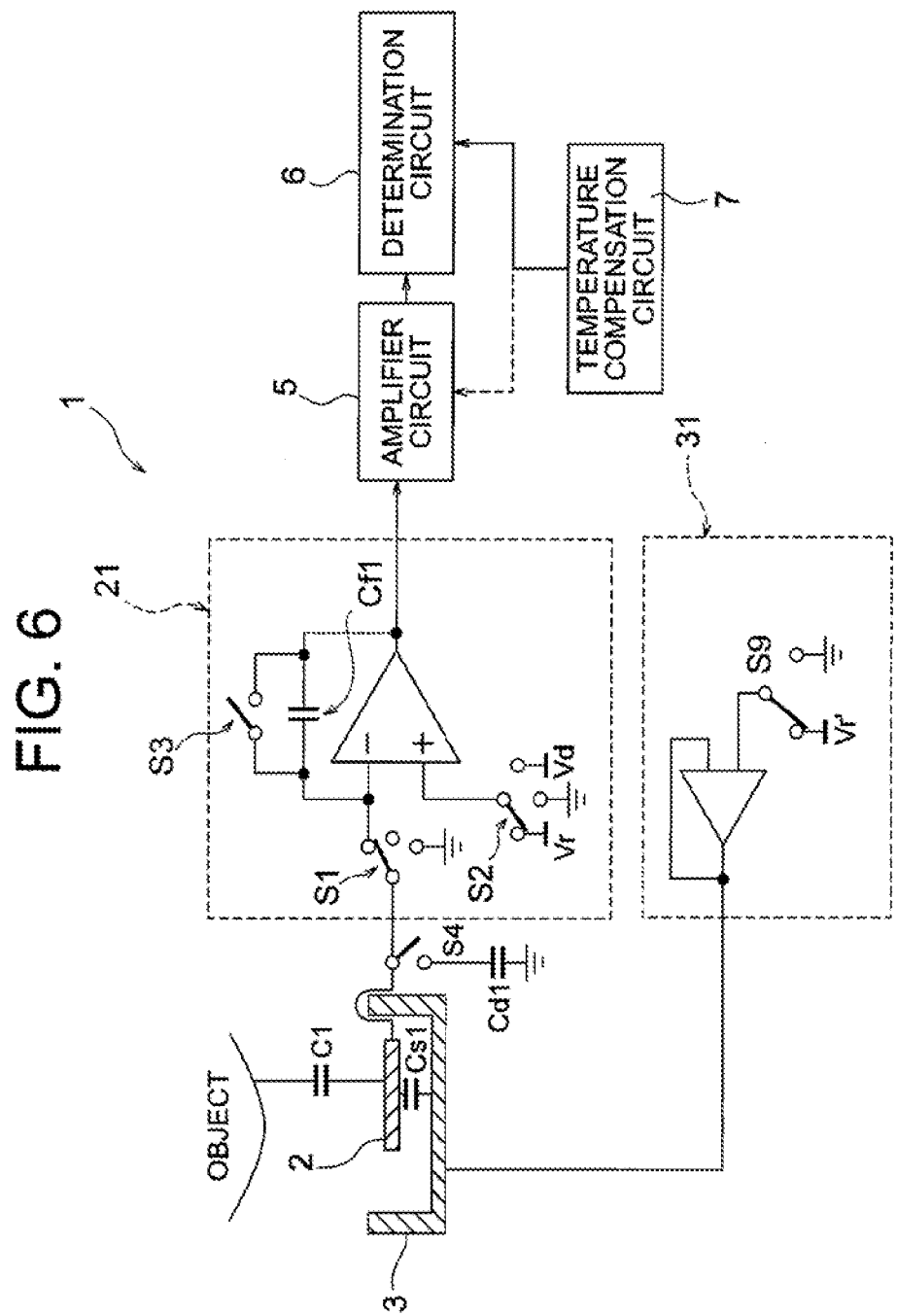
FIG. 6 is a schematic diagram of an electrostatic capacitance sensor according to a first embodiment of the second invention.

FIG. 6 is a diagram illustrating a configuration of the electrostatic capacitance sensor 1.

As shown in FIG. 6, the electrostatic capacitance sensor 1 according to the embodiment of the present invention comprises: a detection electrode 2; a detection electrode control circuit 21; a shield electrode 3 that is provided in the vicinity of the detection electrode 2; a shield drive circuit 31; an amplifier circuit 5 that amplifies a detection signal detected by the detection electrode control circuit 21; and a determination circuit 6 that determines an object detection result and a self-diagnosis result of the electrostatic capacitance sensor 1 on the basis of one or more values of the obtained detection signal.

In addition, a connection between the detection electrode 2 and the detection electrode control circuit 21 is connected via a first switch S4 to one end of a first capacitor Cd1 of which the other end is connected to a fixed electric potential, such as ground, which has a different electric potential from a first electric potential.

The detection electrode 2 in the present embodiment is a plate-like conductor and detects an electrostatic capacitance between this detection electrode 2 and an object when the detection electrode control circuit 21 applies a predetermined electric potential to the detection electrode 2. Note that the shape of the electrode is not limited to plate-like and may be rod-like or other three-dimensional shape.

The shield electrode 3 is provided in the vicinity of the detection electrode 2. The shield electrode 3 in the present embodiment surrounds the detection electrode 2 with the exception of a detection surface of the detection electrode 2 (upper surface of the detection electrode comprised of the plate-like conductor). This allows for detecting with high sensitivity whether an object to be detected (referred simply to as "object") is present or absent within a predetermined region at the detecting surface side of the detection electrode 2 (referred hereinafter to as "detection region") and/or a distance to the object. In addition, the shield electrode 3 is provided with a shield drive circuit 31 that involves a function for applying a predetermined electric potential (Vr') to this shield electrode 3.

The detection electrode control circuit 21 has a function that switches between a first electric potential (Vr) and a second electric potential (Vd) different from the first electric potential to apply them to the detection electrode 2.

In addition, the detection electrode control circuit 21 in the present embodiment detects a first detection signal depending on the electrostatic capacitance detected by the detection electrode 2 when the first electric potential (Vr) is applied to the detection electrode 2, and also detects a second detection signal depending on the electrostatic capacitance detected by the detection electrode 2 when the second electric potential (Vd) is applied to the detection electrode 2. The detection electrode control circuit 21 transmits the detected signals to the amplifier circuit 5 as will be described later.

The electric potential (Vr) applied to the detection electrode 2 may be or may not be the same electric potential as the above-described electric potential (Vr') applied to the shield electrode 3. When the first electric potential (Vr) applied to the detection electrode 2 is the same electric potential as the electric potential (Vr') applied to the shield electrode 3, an electrostatic capacitance (Cs1) between the detection electrode 2 and the shield electrode 3 is not detected, and the detection electrode control circuit 21 can thus detect a detection signal depending on an electrostatic capacitance (C1) between the detection electrode 2 and an object that is present within the detection region.

The value of the second electric potential (Vd) applied to the detection electrode 2 may be, but not limited to, within a range of 80% to 120% of the first electric potential. If the range of the electric potential to be applied is within a range of −20% to +20% relative to the first electric potential, then the first detection signal depending on the electrostatic capacitance when the first electric potential is applied and the second detection signal depending on the electrostatic capacitance when the second electric potential is applied can fall within a dynamic range, and failure diagnosis for the electrostatic capacitance sensor can thus be accurately performed.

In addition, the electrostatic capacitance sensor 1 according to the present embodiment comprises a temperature compensation circuit 7 that has a temperature compensation function for correcting the first detection signal and/or the second detection signal on the basis of the temperature in the vicinity of the detection electrode 2 or the detection electrode control circuit 21. This temperature compensation circuit 7 may be configured as an independent circuit from the amplifier circuit 5 and the determination circuit 6, or may also be configured to be included in the amplifier circuit 5 or the determination circuit 6. The temperature compensation circuit 7 may employ a common means, such as a means that utilizes the temperature characteristic of electric potential in forward direction associated with a diode element. This allows for eliminating the influence of temperatures on the detection result (measurement value).

Moreover, the electrostatic capacitance sensor 1 according to the present embodiment comprises the first switch S4 provided at the connection between the detection electrode 2 and the detection electrode control circuit 21. This first switch S4 connects the connection between the detection electrode 2 and the detection electrode control circuit 21 to one end of the first capacitor Cd1 of which the other end is connected to a fixed electric potential that has a different electric potential from the first electric potential (Vr). As such, the detection signal output from the detection electrode control circuit 21 changes depending on the ON/OFF state of the first switch S4. That is, if the detection electrode control circuit 21 is normal, then the detection signal can be obtained to have a value depending on the first capacitor Cd1 when the first switch S4 is switched from OFF to ON. Here, the first switch S4 is a switch that controls whether or not to connect the one end of the first capacitor Cd1, of which the other end is connected to a fixed electric potential that has a different electric potential from the first fixed electric potential (Vr), to the connection between the detection electrode 2 and the detection electrode control circuit 21.

The amplifier circuit 5 amplifies the detection signal obtained by the detection electrode control circuit 21. This amplifier circuit 5 may comprise a filter for removing noise components. Further, the amplifier circuit 5 transmits the detection signal depending on the electrostatic capacitance detected by the detection electrode 2 to the determination circuit 6 as will be described later.

Functionalities of the determination circuit 6 will then be described. The determination circuit 6 in the present embodiment involves three functionalities below.

The first functionality of the determination circuit 6 is a function for determining whether an object is present or absent within the detection region and/or determining a distance from the object, on the basis of the detection signal depending on the electrostatic capacitance detected by the detection electrode 2. The second functionality is a function for determining whether an electrode abnormality of the detection electrode 2 and/or the shield electrode 3 is present or absent. The third functionality is a function for determining whether an abnormality in detection function of the detection electrode control circuit 21 is present or absent.

Each functionality of the determination circuit 6 will hereinafter be overviewed.

First, the determination circuit 6 determines whether an object is present or absent within the detection region and/or a distance to the object on the basis of the first detection signal depending on the electrostatic capacitance detected when the first electric potential (Vr) is applied to the detection electrode 2. In this operation, the first electric potential (Vr) applied to the detection electrode 2 may be the same value as that of the electric potential (Vr') applied to the shield electrode 3.

Specifically, the determination circuit 6 obtains the first detection signal from the amplifier circuit 5 as the basis to determine the size of and/or the distance to an object that is proximate to the detection electrode 2 within the detection region. The determination circuit 6 determines that an object is present within the detection region if the value of the first detection signal obtained from the amplifier circuit 5 is a predetermined value or more. In addition, the determination circuit 6 calculates the distance between the detection electrode 2 and the object on the basis of the value of the first detection signal obtained from the amplifier circuit 5. Methods for determining whether an object is present or absent within the detection region and the distance to the object are not particularly limited, and any method known at the time of filing this application may appropriately be used.

Second, the determination circuit 6 determines whether an abnormality of the detection electrode 2 or the shield electrode 3 is present or absent, such as breakage, crack, distortion, curvature and other electrode abnormalities of the detection electrode 2 or the shield electrode 3, on the basis of the first detection signal depending on the electrostatic capacitance detected when the first electric potential (Vr) is applied to the detection electrode 2 and the second detection signal depending on the electrostatic capacitance detected when the second electric potential (Vd) is applied to the detection electrode 2.

Specifically, the determination circuit 6 compares values of the first detection signal and the second detection signal to obtain the difference (change amount) therebetween, and determines that an abnormality is present in the detection electrode 2 and/or the shield electrode 3 if the difference is not within a predetermined range. Threshold value (the predetermined range) for determining an abnormality may be preliminarily defined in accordance with the difference between the first electric potential (Vr) and the second electric potential (Vd) which are to be applied to the detection electrode 2.

Third, the determination circuit 6 in the present embodiment compares a detection signal when the first capacitor Cd1 is connected to the connection between the detection electrode 2 and the detection electrode control circuit 21 and a detection signal when the first capacitor Cd1 is not connected thereby to obtain the difference (change amount) therebetween, and determines that an abnormality is present in the detection function of the detection electrode control circuit 21 if the difference is not within a predetermined range.

Thus, the electrostatic capacitance sensor 1 according to the present embodiment has three functional modes: a measurement mode for perceiving presence or absence of an object and measuring the distance to the object; an electrode check mode for detecting an electrode abnormality, such as crack, breakage, distortion and curvature, of the detection electrode 2 and/or the shield electrode 3; and a circuit check mode for detecting an abnormality of the detection electrode control circuit 21, which detects the electrostatic capacitance associated with the detection electrode 2. In the present example, the electrostatic capacitance sensor 1 that involves all of the above functionalities is exemplified for explanation, but the functionality for the circuit check mode may be omitted.

Each control procedure for normal measurement mode A, electrode check mode B and circuit check mode C for the detection electrode control circuit will hereinafter be described with reference to FIGS. 7 to 9.

Figure 7:
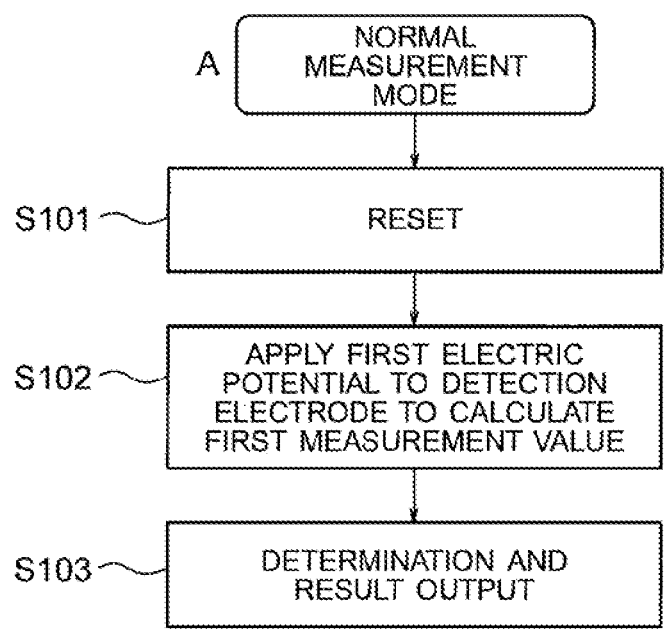
FIG. 7 is a flowchart illustrating a control procedure in a normal measurement mode of the electrostatic capacitance sensor shown in FIG. 6.

FIG. 7 is a flowchart for the normal measurement mode A of the electrostatic capacitance sensor 1 according to the present embodiment.

At step S101 of the flowchart shown in FIG. 7, the electrostatic capacitance sensor 1 discharges the electric charge stored in the detection electrode control circuit 21 for the initialization (reset).

Specifically, switches S1 to S3 in the detection electrode control circuit 21 of the electrostatic capacitance sensor 1 shown in FIG. 6 are switched so that the switch S1 connects the detection electrode 2 to the ground, the switch S2 connects the (+) input side of the operational amplifier in the detection electrode control circuit to the ground, and the switch S3 is turned on to short-circuit the capacitor Cf1. This allows the electric charge stored in the detection electrode control circuit 21 to be discharged. During this operation, the shield electrode 3 is connected to the ground by switch S9 in the shield drive circuit 31. In addition, the first switch S4 is turned off, so that the first capacitor Cd1 is not connected to the connection between the detection electrode 2 and the detection electrode control circuit 21.

Next at step S102, the first electric potential (Vr) is applied to the detection electrode 2 while the predetermined electric potential (Vr') is applied to the shield electrode 3, and a first measurement value (first detection signal) is calculated depending on the electrostatic capacitance detected by the detection electrode 2.

Specifically, the switch S9 in the shield drive circuit 31 of the electrostatic capacitance sensor 1 shown in FIG. 6 is switched to connect the shield electrode 3 to the predetermined electric potential (Vr'), while the switches S1 to S3 in the detection electrode control circuit 21 are switched so that the switch S1 connects the detection electrode 2 to the (−) input side of the operational amplifier, the switch S2 connects the (+) input side of the operational amplifier to the predetermined electric potential (Vr), and the switch S3 opens the capacitor Cf1 to charge the capacitor Cf1 with an electric charge of Qf1=Vr×C1+(Vr−Vr')×Cs1. Thereafter, the switch S1 opens the detection electrode 2 while the switch S2 connects the (+) input side of the operational amplifier to the ground, and the first measurement value is thereby calculated as an electric potential of V=(Vr×C1+(Vr−Vr'×Cs1)/Cf1.

Note that the predetermined electric potential (Vr') applied to the shield electrode 3 may be made to be the same electric potential as the first electric potential (Vr) applied to the detection electrode 2 thereby causing the electrostatic capacitance (Cs1) between the detection electrode 2 and the shield electrode 3 not to be detected, and the measurement value (electric potential V=Vr×(C1/Cf1)) can be obtained depending on the electrostatic capacitance between the detection electrode 2 and an object.

Further at step S103, the determination circuit 6 uses the value of the first detection signal as the basis to determine whether an object (object to be detected) is present or not within the detection region detectable by the detection electrode 2 and to obtain the distance between the detection electrode 2 and the object (the detected object). According to the above procedure, the process of the measurement mode A is performed for perceiving the presence of an object and measuring the distance to the object.

The process of the electrode check mode B for the electrostatic capacitance sensor 1 according to the present embodiment will then be described with reference to FIG. 8.

Figure 8:
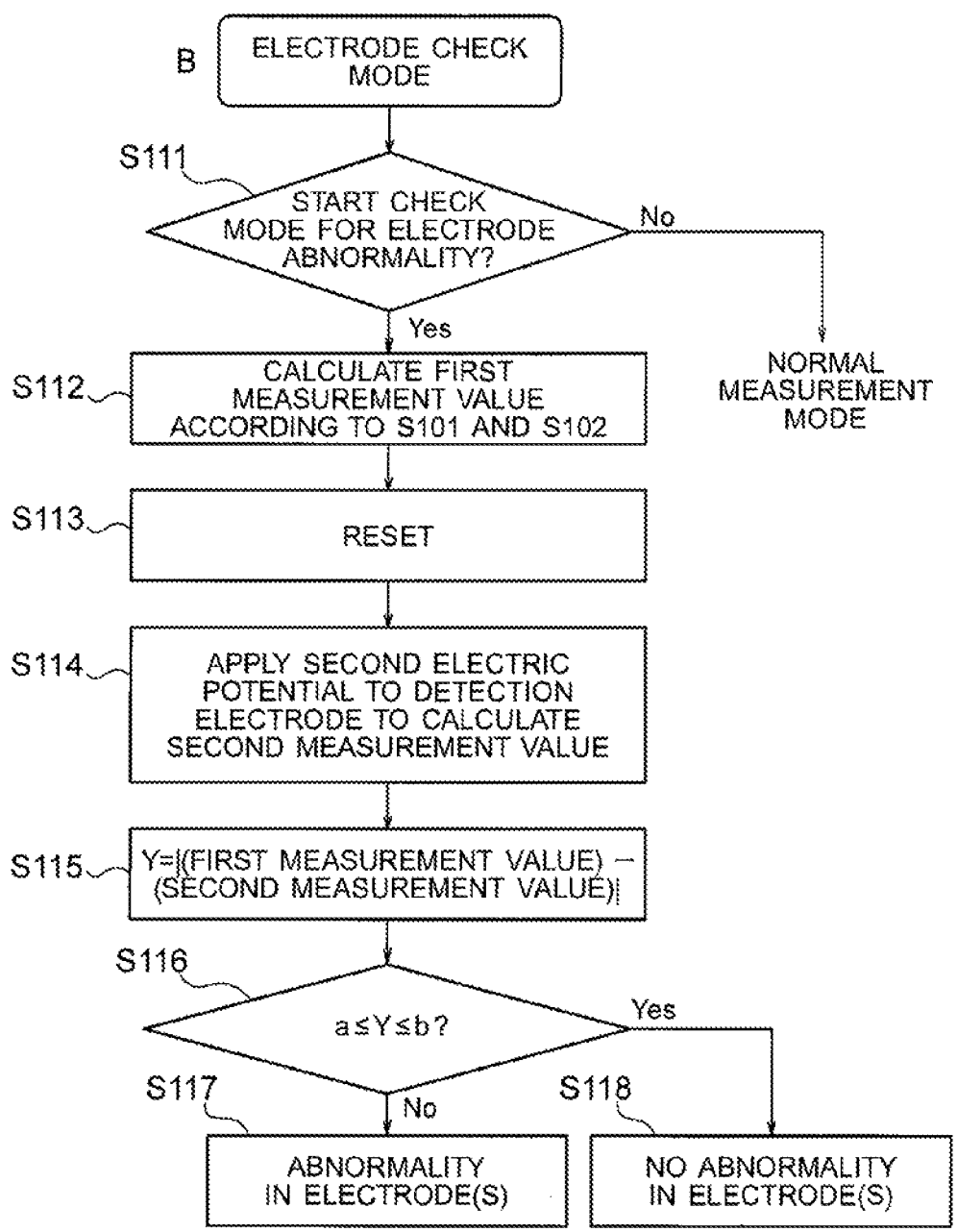
FIG. 8 is a flowchart illustrating a control procedure in an electrode check mode of the electrostatic capacitance sensor shown in FIG. 6.

At step S111 of FIG. 8, the determination circuit 6 waits for the process start timing of the electrode check mode B while processing the normal measurement mode A. The electrode check mode B may be performed with a predetermined period or at a predetermined timing such as when the process is completed or started, or otherwise be performed if a predetermined condition is satisfied such as when variation in the output value is observed.

At step S112, the above-described steps S101 to S102 shown in FIG. 7 are performed to obtain the first measurement value (first detection signal) because the determination of an electrode abnormality is performed through the comparison with the normal measurement value. In the present process, the first measurement value (first detection signal) that has been previously output may also be read out.

Subsequently at step S113, the electrostatic capacitance sensor 1 performs the above-described step S101 shown in FIG. 7 to switch the switches S1 to S3 in the detection electrode control circuit 21 of the electrostatic capacitance sensor 1 shown in FIG. 6 thereby discharging the electric charge stored in the detection electrode control circuit 21 for the initialization (reset).

At step S114 which is performed after or before step S113, the detection electrode control circuit 21 applies a second electric potential (Vd) that is different from the first electric potential (Vr) to the detection electrode 2. Further, like the above-described step S102 shown in FIG. 7, the switches S1 to S3 in the detection electrode control circuit 21 of the electrostatic capacitance sensor 1 shown in FIG. 6 are switched, and a second measurement value (second detection signal) is thereby calculated depending on the electrostatic capacitance detected by the detection electrode 2 when the second electric potential (Vd) is applied to the detection electrode 2.

At steps S115 and S116, the determination circuit 6 determines an abnormality of the detection electrode and/or the shield electrode on the basis of the first measurement value and the second measurement value (the first detection signal and the second detection signal). Specifically at step S115, the determination circuit 6 calculates a difference (change amount) Y between the first measurement value and the second measurement value. Then at step S116, the determination circuit 6 determines whether the difference Y between the first measurement value and the second measurement value is within a predetermined range (a≤Y≤b) or not.

The electrostatic capacitance (Cs1) between the detection electrode 2 and the shield electrode 3 depends on areas of the detection electrode and the shield electrode and the distance therebetween. As such, whether or not the change amount of the electrostatic capacitance (Cs1) between the detection electrode 2 and the shield electrode 3 caused by switching the electric potential applied to the detection electrode 2 is within a predetermined certain range may be used as the basis to determine whether or not an electrode abnormality, such as breakage, wire breaking, curvature or distortion, occurs in the detection electrode 2 or the shield electrode 3. That is, if the difference (change amount) between the first measurement value and the second measurement value is not within the predetermined range, then it can be determined that an electrode abnormality, such as breakage, wire breaking, curvature or distortion, occurs in the detection electrode 2 or the shield electrode 3.

The electrostatic capacitance sensor 1 according to the present embodiment preliminarily sets the range (a≤Y≤b) of the change amount of the electrostatic capacitance (Cs1) between the detection electrode 2 and the shield electrode 3, which is caused by switching the electric potential applied to the detection electrode 2 when an electrode abnormality does not occur, and determines whether or not the difference Y is within the predetermined range. If the difference Y is not within the predetermined range, then the process proceeds to step S117 and the determination circuit 6 determines that an abnormality is present in the detection electrode 2 or the shield electrode 3. If, on the other hand, the difference Y is within the predetermined range, then the process proceeds to step S118 and the determination circuit 6 determines that no abnormality is present in the detection electrode 2 and shield electrode 3.

Thus, the electrostatic capacitance sensor 1 according to the present embodiment switches and provides two different electric potentials Vr and Vd to the detection electrode 2 thereby to obtain the first measurement value and the second measurement value (the first detection signal and the second detection signal), and compares them to detect an electrode abnormality of the electrostatic capacitance sensor 1. Therefore, an electrode abnormality can be detected with a high degree of accuracy because, taking into consideration the electrostatic capacitance (Cs1) between the detection electrode 2 and the shield electrode 3 provided in the vicinity of the detection electrode 2, an electrode abnormality is detected using the change in the electrostatic capacitance when two different electric potentials are applied to the detection electrode 2.

Finally, the circuit check mode C for the detection electrode control circuit of the electrostatic capacitance sensor 1 according to the present embodiment will be described with reference to FIG. 9.

At step S201, the determination circuit 6 waits for the start timing of the circuit check mode C. Like the process at step S111 in the above-described electrode check mode B, the determination circuit 6 performs the circuit check mode C with a predetermined period or at a predetermined timing, or otherwise if a predetermined condition is satisfied.

At step S202, the connection between the detection electrode 2 and the detection electrode control circuit 21 is disconnected from the first capacitor Cd1, followed by step S203 where the first detection signal (first A measurement value) is obtained. In other words, the steps S101 to S102 shown in FIG. 7 are performed in the state where the first switch S4 is turned off, which is connected to the connection between the detection electrode 2 and the detection electrode control circuit 21 of the electrostatic capacitance sensor 1 shown in FIG. 6.

At the subsequent step S204, the first switch S4 is turned on to connect one end of the first capacitor Cd1 to the connection between the detection electrode 2 and the detection electrode control circuit 21. The other end of the first capacitor Cd1 is connected to an electric potential which is different from the first electric potential and which may be the ground electric potential or otherwise be set as being a certain electric potential.

At the subsequent step S205, the determination circuit 6 obtains the first detection signal (first B measurement value) when the switch S4 is turned on.

Further at step S206, the determination circuit 6 calculates a difference Z between the first detection signals (between the first A measurement value and the first B measurement value).

Thereafter at step S207, the determination circuit 6 determines whether the difference Z is within a predetermined range ($c \leq Z \leq d$) or not.

If the detection electrode control circuit 21 for electrostatic capacitance detection is normal, then there occurs a change between the detection signal (first B measurement value) obtained when the first capacitor Cd1 is connected to the connection between the detection electrode 2 and the detection electrode control circuit 21 and the detection signal (first A measurement value) obtained when the first capacitor Cd1 is not connected, and the change depends on the connected first capacitor Cd1. That is, if the difference Z between the first A measurement value and the first B measurement value is not within a range that depends on the connected first capacitor Cd1, then the detection electrode control circuit 21 is presumed to have a failure.

Therefore, in the determination at step S207, if the difference Z is within the predetermined range, then the detection electrode control circuit is determined to be normal (step S208), while on the other hand, if the difference Z is not within the predetermined range, then the detection electrode control circuit 21 is determined to be abnormal (step S209).

Second Embodiment of the Second Invention

A second embodiment of the second invention will hereinafter be described. An electrostatic capacitance sensor according to the second embodiment of the second invention is further provided with a reference electrode 4 and a reference electrode control circuit 41 in addition to the electrostatic capacitance sensor according to the first embodiment, and a differential amplifier circuit 51 substituted for the amplifier circuit.

The second embodiment will hereinafter be described with reference to FIG. 10.

As shown in FIG. 10, the electrostatic capacitance sensor 1 according to the second embodiment of the present invention comprises: a detection electrode 2; a detection electrode control circuit 21; a shield electrode 3 that is provided in the vicinity of the detection electrode 2; a shield drive circuit 31; the reference electrode 4; the reference electrode control circuit 41; the differential amplifier circuit 51 that amplifies a difference between a detection signal detected by the detection electrode control circuit 21 and a detection signal detected by the reference electrode control circuit 41; and a determination circuit 6 that determines an object detection result and a self-diagnosis result of the electrostatic capacitance sensor 1 on the basis of values of the obtained detection signals.

In addition, a connection between the detection electrode 2 and the detection electrode control circuit 21 is connected via a first switch S4 to one end of a first capacitor Cd1 of which the other end is connected to a fixed electric potential different from a first electric potential, while a connection between the reference electrode 4 and the reference electrode control circuit 41 is connected via a second switch S14 to one end of a second capacitor Cd2 of which the other end is connected to a fixed electric potential different from the first electric potential.

The detection electrode 2, the detection electrode control circuit 21, the shield electrode 3, the shield drive circuit 31, the determination circuit 6 and the first switch S4 in the second embodiment involve the same functionalities as those of respective configurations in the above-described first embodiment. In order to avoid redundant explanation herein, the description will be made to be assisted by the explanation for the common configurations and functionalities with the electrostatic capacitance sensor 1 according to the first embodiment.

The reference electrode 4 in the present embodiment is a plate-like conductor. This reference electrode 4 is configured to be able to detect an electrostatic capacitance of the surrounding environment of the detection electrode 2 at the time of detection without being affected by an object to be detected, such as through being formed sufficiently smaller than the detection electrode 2, being surrounded in its entire perimeter by the shield electrode 3, and being disposed at a location where the object to be detected does not exist. Note that the shape of the reference electrode is not limited to plate-like and may be rod-like or other three-dimensional shape.

The reference electrode control circuit 41 detects a reference signal depending on an electrostatic capacitance when a predetermined electric potential is applied to the reference electrode 4. This electrostatic capacitance detected by the reference electrode 4 is subtracted from the electrostatic capacitance detected by the detection electrode 2, and an electrostatic capacitance can thus be detected in consideration of the influence from the environment at the time of detection. Although not particularly limited, it is preferred that the electric potential applied to the detection electrode 2 and the electric potential applied to the reference electrode 4 are the same. The reference electrode control circuit 41 transmits the detected signal to the differential amplifier circuit 51 as will be described later.

The differential amplifier circuit 51 in the present embodiment has a functionality that subtracts a value of the detection signal detected by the reference electrode control circuit 41 from a value of the detection signal detected by the detection electrode control circuit 21 thereby to obtain a detection signal depending on the electrostatic capacitance between the detection electrode 2 and an object. This differential amplifier circuit 51 may comprise a filter for removing noise components. Further, the differential amplifier circuit 51 transmits the detection signal depending on the electrostatic capacitance between the detection electrode 2 and the object to the determination circuit 6 as will be described later.

The differential amplifier circuit 51 in the present embodiment also takes into consideration the detection signal depending on the electrostatic capacitance detected by the reference electrode 4 when obtaining each of the above-described first measurement value and second measurement value (the first detection signal and the second detection signal). Specifically, at the time of obtaining the first measurement value (first detection signal), the differential amplifier circuit 51 subtracts, from the electrostatic capacitance detected by the detection electrode 2 when the first electric potential (Vr) is applied to the detection electrode 2, the electrostatic capacitance detected by the reference electrode 4 at the same timing, thereby to obtain the first measurement value (first detection signal).

Similarly, at the time of obtaining the second detection signal, the differential amplifier circuit 51 subtracts, from the electrostatic capacitance detected by the detection electrode 2 when the second electric potential (Vd) is applied to the detection electrode 2, the electrostatic capacitance detected by the reference electrode 4 at the same timing, thereby to obtain the second measurement value (second detection signal). The differential amplifier circuit 51 transmits these values to the determination circuit 6. Note that, at the timing where the first electric potential (Vr) is applied to the detection electrode 2 when the first measurement value is obtained, the same first electric potential (Vr) may be applied to the reference electrode 4, and at the timing where the second electric potential (Vd) is applied to the detection electrode 2 when the second measurement value is obtained, the same second electric potential (Vd) may be applied to the reference electrode 4.

Also when the above-described first A measurement value and first B measurement value (the first A detection signal and the first B detection signal) are each obtained, the detection signal depending on the electrostatic capacitance detected by the reference electrode 4 may also be taken into consideration. Specifically, at the time of obtaining the first A detection signal, the differential amplifier circuit 51 subtracts, from the electrostatic capacitance detected by the detection electrode 2 when the first switch S4 does not connect the first capacitor Cd1 to the connection between the detection electrode 2 and the detection electrode control circuit 21, the electrostatic capacitance detected at the same timing by the reference electrode 4 when the second switch S14 does not connect the second capacitor Cd2 to the connection between the reference electrode 4 and the reference electrode control circuit 41, thereby to obtain the first A measurement value (detection signal).

Similarly, at the time of obtaining the first B measurement value (detection signal), the differential amplifier circuit 51 subtracts, from the electrostatic capacitance detected by the detection electrode 2 when the first switch S4 does connect the first capacitor Cd1 to the connection between the detection electrode 2 and the detection electrode control circuit 21, the electrostatic capacitance detected at the same timing by the reference electrode 4 when the second switch S14 does connect the second capacitor Cd2 to the connection between the reference electrode 4 and the reference electrode control circuit 41, thereby to obtain the first B measurement value (detection signal). The differential amplifier circuit 51 transmits these values to the determination circuit 6.

The determination circuit 6 can determine that an object is present within a predetermined detection region if the first measurement value (the value of the first detection signal) depending on the electrostatic capacitance obtained from the differential amplifier circuit 51 is a predetermined value or more. In addition, the determination circuit 6 uses the value of the first detection signal as the basis to obtain a distance to a human body with reference to correspondence information which associates the first measurement value (the value of the first detection signal) with a distance to a human body (object). According to the above process, the process of a measurement mode A is performed for perceiving the presence of an object and measuring the distance to the object like the first embodiment.

In addition, the determination circuit 6 obtains the first measurement value and the second measurement value (the first detection signal and the second detection signal) depending on the electrostatic capacitances from the differential amplifier circuit 51 as the basis to perform a check mode B associated with the determination for an electrode abnormality of the detection electrode, the reference electrode and the shield electrode like the check mode for an electrode abnormality in the first embodiment.

Further, the determination circuit 6 obtains the first A measurement value and the first B measurement value (the first A detection signal and the first B detection signal) depending on the electrostatic capacitances from the differential amplifier circuit 51 as the basis to perform a circuit check mode C associated with the determination for a circuit abnormality of the reference electrode control circuit 41 like the check mode for the detection electrode control circuit 21 in the first embodiment.

Thus, the electrostatic capacitance sensor 1 according to the present embodiment switches and provides two different electric potentials Vr and Vd to the detection electrode 2 thereby to obtain the first detection signal and the second detection signal, and uses the difference therebetween as the basis to detect an abnormality, such as crack or breakage, of the detection electrode and/or the shield electrode 3. Therefore, an abnormality of electrodes can be detected without providing any extra electrode and circuit.

The processing of the electrostatic capacitance sensor 1 according to the present embodiment will be described. Basic processing procedures for the measurement mode A, the electrode check mode B and the circuit check mode C of the electrostatic capacitance sensor 1 according to the present embodiment are common with those of the first embodiment, so the description will be focused on different features with assistance provided by the description for FIG. 7 to FIG. 9.

The operation of the measurement mode A proceeds along the flowchart shown in FIG. 7. During the measurement mode, the switches S11 to S13 of the reference electrode control circuit 41 perform similar operations to those of the switches S1 to S3 of the detection electrode control circuit 21. Although not particularly limited, when the detection electrode 2 is applied thereto with the first electric potential (Vr), the reference electrode 4 is also applied thereto with the first electric potential (Vr).

The operation of the electrode check mode B proceeds along the flowchart shown in FIG. 8. During the process for the electrode check mode B, the switch S12 of the reference electrode control circuit 41 performs similar operation to that of the switch S2 of the detection electrode control circuit 21. That is, when the detection electrode 2 is applied thereto with the first electric potential (Vr), the reference electrode 4 is also applied thereto with the first electric potential (Vr), and when the detection electrode 2 is applied thereto with the second electric potential (Vd), the reference electrode 4 is also applied thereto with the second electric potential (Vd).

Specifically, when the first electric potential (Vr) is applied to the detection electrode 2 at step S112 of FIG. 8, the first electric potential (Vr) is also applied to the reference electrode 4 to calculate the first measurement value, and when the second electric potential (Vd) is applied to the detection electrode 2 at step S114, the second electric potential (Vd) is also applied to the reference electrode 4 to calculate the second measurement value, thereafter this second measurement value can be compared with the first measurement value to determine a failure of the detection electrode 2, the shield electrode 3 or the reference electrode 4 (electrode check pattern 1).

The operation of the switch S12 is not limited to an aspect that the same electric potential is applied to the detection electrode 2 and the reference electrode 4, and another operation may also be possible as below.

For example, when the second electric potential (Vd) is applied to the detection electrode 2 at step S114 of FIG. 8, the switch S12 may be switched to apply the first electric potential (Vr) to the reference electrode 4 to calculate the second measurement value, and this second measurement value can be compared with the first measurement value that was measured in the measurement mode (step S112), thereby to determine a failure of the detection electrode 2 and/or the shield electrode 3 (electrode check pattern 2).

Alternatively or additionally, the first electric potential (Vr) may be applied to the detection electrode 2 at step S114 of FIG. 8 while the switch S12 is switched to apply the second electric potential (Vd) to the reference electrode 4 to calculate the second measurement value, and this second measurement value can be compared with the first measurement value that was measured in the measurement mode (step S112), thereby to determine a failure of the reference electrode 4 and/or the shield electrode 3 (electrode check pattern 3).

Among the above-described electrode check patterns 1, 2 and 3, only the electrode check pattern 1 may be performed, the electrode check patterns 2 and 3 may be performed, or all of the electrode check patterns 1, 2 and 3 may be performed.

Figure 9:
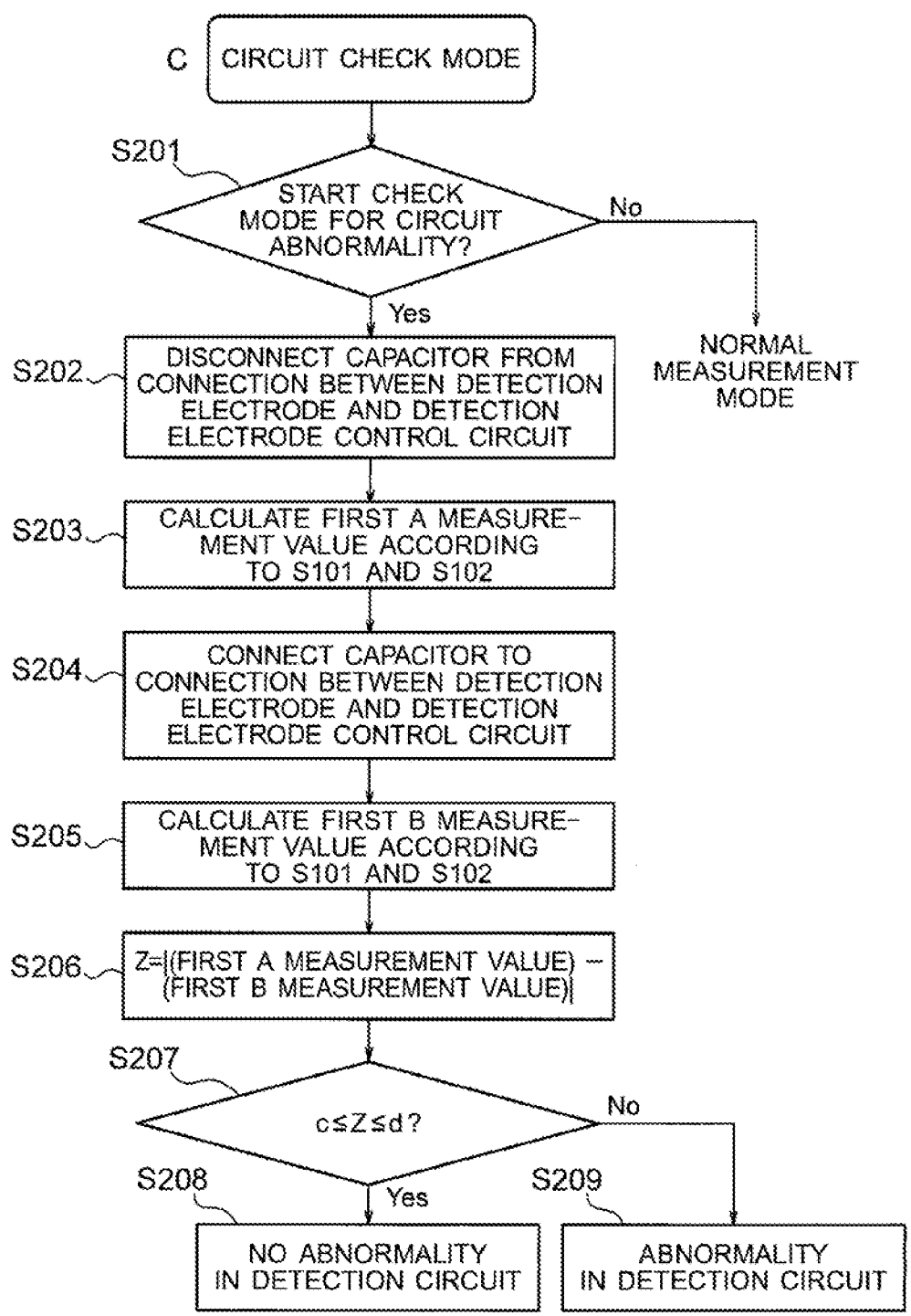
FIG. 9 is a flowchart illustrating a control procedure in a circuit check mode of the electrostatic capacitance sensor shown in FIG. 6.

The operation of the circuit check mode C is performed along the flowchart shown in FIG. 9.

During the operation of the circuit check mode C, the second switch S14 performs a similar operation to that of the first switch S4. That is, when the first capacitor Cd1 is connected to the detection electrode 2 at step S204 of FIG. 9, the second capacitor Cd2 is at the same time connected to the reference electrode 4, and in this state the first B measurement value is measured. This first B measurement value is compared with the first A measurement value measured in the state where the first capacitor Cd1 and the second capacitor Cd2 are disconnected (measured at step S203), thereby to perform circuit check (step S206 and subsequent steps). This allows for checking the detection electrode control circuit 21 and/or the reference electrode control circuit 41.

The above embodiment has been described as an example where the second switch S14 of the reference electrode control circuit 41 performs a similar operation to that of the first switch S4 of the detection electrode control circuit 21, but an aspect of the circuit check is not limited thereto.

For example, when the first capacitor Cd1 is connected to the detection electrode 2, the second capacitor Cd2 may be disconnected from the reference electrode 4 to measure a first B1 measurement value, and this first B1 measurement value may be compared with the first A measurement value measured in the state where the first capacitor Cd1 and the second capacitor Cd2 are disconnected, thereby to perform the check for the detection electrode control circuit 21.

Alternatively or additionally, when the first capacitor Cd1 is disconnected from the detection electrode 2, the second capacitor Cd2 may be connected to the reference electrode 4 to measure a first B2 measurement value, and this first B2 measurement value may be compared with the first A measurement value measured in the state where the first capacitor Cd1 and the second capacitor Cd2 are disconnected, thereby to perform the check for the reference electrode control circuit 41.

The embodiments heretofore explained are described to facilitate understanding of the present invention and are not described to limit the present invention. Therefore, it is intended that the elements disclosed in the above embodiments include all design changes and equivalents to fall within the technical scope of the present invention.

Note that the electrostatic capacitance sensor 1 according to the second embodiment may also be provided with a temperature compensation circuit 7 that has a temperature compensation function for correcting the first detection signal and/or the second detection signal on the basis of the temperature in the vicinity of the detection electrode 2 or the detection electrode control circuit 21 or the temperature in the vicinity of the reference electrode 4 or the reference electrode control circuit 41. This temperature compensation circuit 7 may be configured as an independent circuit from the differential amplifier circuit 51 and the determination circuit 6, or may also be configured to be included in the differential amplifier circuit 51 or the determination circuit 6.

In the present embodiment, as one example of the electrostatic capacitance sensor according to the present invention that comprises a detection electrode, a detection electrode control means, a shield electrode and a determination means, the electrostatic capacitance sensor 1 has been described which comprises the detection electrode 2, the detection electrode control circuit 21, the shield electrode 3, the differential amplifier circuit 51 and the determination circuit 6, but the present invention is not limited thereto. Further, as one example of the electrostatic capacitance sensor that comprises a reference electrode and a reference electrode control means, the electrostatic capacitance sensor 1 has been described which further comprises the reference electrode 4 and the reference electrode control circuit 41, but the present invention is not limited thereto. In addition, as one example of the electrostatic capacitance sensor that comprises a temperature compensation means, the electrostatic capacitance sensor 1 has been described which comprises the temperature compensation circuit 7, but the present invention is not limited thereto. It should be appreciated that the present embodiment has been described for an example in which the determination means is configured as a circuit for determining whether an abnormality of the detection electrode and/or the shield electrode is present or absent, but the determination means may also be configured as software.

DESCRIPTION OF REFERENCE NUMERALS

With Respect to the First Invention

1 . . . Electrostatic capacitance sensor
2 . . . Detection electrode

21 . . . Detection electrode control circuit
3 . . . Shield electrode
31 . . . Shield drive circuit
4 . . . Reference electrode
41 . . . Reference electrode control circuit
5 . . . Amplifier circuit
51 . . . Differential amplifier circuit
6 . . . Determination circuit
7 . . . Temperature compensation circuit
S1-S3, S11-S13 . . . Switches
  S4 . . . First switch
  S14 . . . Second switch
  S9 . . . Switch
  Vr . . . Predetermined electric potential
  Vr' . . . First electric potential
  Vd . . . Second electric potential With Respect to the Second Invention 1 . . . Electrostatic capacitance sensor
2 . . . Detection electrode
21 . . . Detection electrode control circuit
3 . . . Shield electrode
31 . . . Shield drive circuit
4 . . . Reference electrode
41 . . . Reference electrode control circuit
5 . . . Amplifier circuit
51 . . . Differential amplifier circuit
6 . . . Determination circuit
7 . . . Temperature compensation circuit
S1-S3, S11-S13 . . . Switches
  S4 . . . First switch
  S14 . . . Second switch
  S9 . . . Switch
  Vr . . . First electric potential
  Vd . . . Second electric potential
  Vr' . . . Predetermined electric potential

What is claimed is:

1. An electrostatic capacitance sensor comprising:
a detection electrode that detects an electrostatic capacitance between the detection electrode and an object;
a shield electrode that is disposed in vicinity of the detection electrode;
a shield drive means that switches between a first electric potential and a second electric potential different from the first electric potential to apply the first or second electric potential to the shield electrode, wherein the first electric potential and the second electric potential are different from a ground potential, and the shield drive means is connected to the shield electrode;
a detection means that outputs a detection signal depending on the electrostatic capacitance detected by the detection electrode, wherein the detection means is connected to the detection electrode; and
a determination means that obtains a first detection signal and a second detection signal from the detection means as a basis to determine whether an abnormality of the detection electrode and/or the shield electrode is present or absent, the first detection signal depending on the electrostatic capacitance detected by the detection electrode when the shield drive means applies the first electric potential to the shield electrode, the second detection signal depending on the electrostatic capacitance detected by the detection electrode when the shield drive means applies the second electric potential to the shield electrode.

2. The electrostatic capacitance sensor as set forth in claim 1, wherein
the determination means determines that an abnormality of the detection electrode and/or the shield electrode is present if a difference between values of the first detection signal and the second detection signal is not within a predetermined range.

3. The electrostatic capacitance sensor as set forth in claim 1, wherein
an electric potential applied to the detection electrode and the first electric potential applied to the shield electrode are the same electric potential when the first detection signal is obtained.

4. The electrostatic capacitance sensor as set forth in claim 1, wherein
a connection between the detection electrode and the detection means is connected via a first switch to one end of a first capacitor of which other end is connected to a fixed electric potential different from the first electric potential, and
the determination means determines that the detection means is abnormal in its detection function if a difference between a detection signal when the first capacitor is connected to the connection and a detection signal when the first capacitor is disconnected from the connection is not within a predetermined range.

5. The electrostatic capacitance sensor as set forth in claim 1, further comprising:
a reference electrode provided to be independent from the detection electrode; and
a reference electrode control means that outputs a reference signal depending on an electrostatic capacitance detected by the reference electrode, wherein
the determination means determines whether an abnormality of the detection electrode and/or the shield electrode is present or absent on a basis of the first detection signal and the second detection signal,
the first detection signal is obtained on a basis of a detection signal depending on the electrostatic capacitance detected by the detection electrode and the reference signal depending on the electrostatic capacitance detected by the reference electrode when the shield drive means applies the first electric potential to the shield electrode, and
the second detection signal is obtained on a basis of a detection signal depending on the electrostatic capacitance detected by the detection electrode and the reference signal depending on the electrostatic capacitance detected by the reference electrode when the shield drive means applies the second electric potential different from the first electric potential to the shield electrode.

6. The electrostatic capacitance sensor as set forth in claim 5, wherein
a connection between the reference electrode and the reference electrode control means is connected via a second switch to one end of a second capacitor of which other end is connected to a fixed electric potential different from the first electric potential, and
the determination means determines that the detection means is abnormal in its detection function if a difference between a detection signal when the second switch connects the second capacitor to the connection between the reference electrode and the reference electrode control means and a detection signal when the second switch disconnects the second capacitor from the connection is not within a predetermined range.

7. The electrostatic capacitance sensor as set forth in claim 1, further comprising:
a temperature compensation means that has a function for detecting a temperature in vicinity of the detection electrode or the detection means as a basis to correct the first detection signal and/or the second detection signal.

8. The electrostatic capacitance sensor as set forth in claim 1, wherein
the second electric potential is within a range of 80% to 120% of the first electric potential.

9. A method for determining a failure of an electrostatic capacitance sensor, the method comprising:
detecting a first detection signal depending on an electrostatic capacitance detected by a detection electrode when a first electric potential is applied to a shield electrode provided in vicinity of the detection electrode and a predetermined electric potential is applied to the detection electrode;
detecting a second detection signal depending on an electrostatic capacitance detected by the detection electrode when a second electric potential different from the first electric potential is applied to the shield electrode and the predetermined electric potential is applied to the detection electrode, wherein the first electric potential and the second electric potential are different from a ground potential; and
determining whether an abnormality of the detection electrode is present or absent on a basis of the first detection signal and the second detection signal.

10. The method for determining a failure of an electrostatic capacitance sensor as set forth in claim 9, comprising:
connecting via a first switch a connection between the detection electrode and an output section for a detection signal depending on the electrostatic capacitance detected by the detection electrode to one end of a first capacitor of which other end is connected to a fixed electric potential different from the first electric potential; and
determining that a function for detecting the detection signal is abnormal if a difference between a detection signal when the first switch connects the first capacitor to the connection and a detection signal when the first switch disconnects the first capacitor from the connection is not within a predetermined range.

11. An electrostatic capacitance sensor comprising:
a detection electrode that detects an electrostatic capacitance between the detection electrode and an object;
a shield electrode that is disposed in vicinity of the detection electrode;
a detection electrode control means that switches between a first electric potential and a second electric potential different from the first electric potential to apply the first or second electric potential to the detection electrode and outputs a detection signal depending on the electrostatic capacitance detected by the detection electrode, wherein the first electric potential and the second electric potential are different from a ground potential, and the detection electrode control means is connected to the detection electrode;
a shield drive means that is connected to the shield electrode and applies a predetermined electric potential to the shield electrode; and
a determination means that determines whether an abnormality of the detection electrode and/or the shield electrode is present or absent on a basis of a first detection signal depending on the electrostatic capacitance detected by the detection electrode when the detection electrode control means applies the first electric potential to the detection electrode and a second detection signal depending on the electrostatic capacitance detected by the detection electrode when the detection electrode control means applies the second electric potential to the detection electrode.

12. The electrostatic capacitance sensor as set forth in claim 11, wherein
the determination means determines that an abnormality of the detection electrode and/or the shield electrode is present if a difference between values of the first detection signal and the second detection signal is not within a predetermined range.

13. The electrostatic capacitance sensor as set forth in claim 11, wherein
the first electric potential applied to the detection electrode is the same electric potential as an electric potential applied to the shield electrode when the first detection signal is obtained.

14. The electrostatic capacitance sensor as set forth in claim 11, wherein
a connection between the detection electrode and the detection electrode control means is connected via a first switch to one end of a first capacitor of which other end is connected to a fixed electric potential different from the first electric potential, and
the determination means determines that the detection electrode control means is abnormal in its detection function if a difference between a detection signal when the first capacitor is connected to the connection and a detection signal when the first capacitor is disconnected from the connection is not within a predetermined range.

15. The electrostatic capacitance sensor as set forth in claim 11, further comprising:
a reference electrode provided to be independent from the detection electrode; and
a reference electrode control means that outputs a reference signal depending on an electrostatic capacitance detected by the reference electrode, wherein
the determination means determines whether an abnormality of the detection electrode and/or the shield electrode is present or absent on a basis of the first detection signal and the second detection signal,
the first detection signal is obtained on a basis of a detection signal depending on the electrostatic capacitance detected by the detection electrode and the reference signal depending on the electrostatic capacitance detected by the reference electrode when the detection electrode control means applies the first electric potential to the detection electrode, and
the second detection signal is obtained on a basis of a detection signal depending on the electrostatic capacitance detected by the detection electrode and the reference signal depending on the electrostatic capacitance detected by the reference electrode when the detection electrode control means applies the second electric potential different from the first electric potential to the detection electrode.

16. The electrostatic capacitance sensor as set forth in claim 15, wherein
a connection between the reference electrode and the reference electrode control means is connected via a second switch to one end of a second capacitor of which other end is connected to a fixed electric potential different from the first electric potential, and
the determination means determines that the detection electrode control means is abnormal in its detection function if a difference between a detection signal when the second switch connects the second capacitor to the connection between the reference electrode and the reference electrode control means and a detection signal when the second switch disconnects the second capacitor from the connection is not within a predetermined range.

17. The electrostatic capacitance sensor as set forth in claim 11, further comprising:
   a temperature compensation means that has a function for detecting a temperature in vicinity of the detection electrode or the detection electrode control means as a basis to correct the first detection signal and/or the second detection signal.

18. The electrostatic capacitance sensor as set forth in claim 11, wherein
   the second electric potential is within a range of 80% to 120% of the first electric potential.

19. A method for determining a failure of an electrostatic capacitance sensor, the method comprising:
   detecting a first detection signal depending on an electrostatic capacitance detected by a detection electrode when a first electric potential is applied to the detection electrode and a redetermined electric potential is a lied to a shield electrode;
   detecting a second detection signal depending on an electrostatic capacitance detected by the detection electrode when a second electric potential different from the first electric potential is applied to the detection electrode and the predetermined electric potential is applied to the shield electrode, wherein the first electric potential and the second electric potential are different from a ground potential; and
   determining whether an abnormality of the detection electrode is present or absent on a basis of the first detection signal and the second detection signal.

20. The method for determining a failure of an electrostatic capacitance sensor as set forth in claim 19, comprising:
   connecting via a first switch a connection between the detection electrode and an output section for a detection signal depending on the electrostatic capacitance detected by the detection electrode to one end of a first capacitor of which other end is connected to a fixed electric potential different from the first electric potential; and
   determining that a function for detecting the detection signal is abnormal if a difference between a detection signal when the first switch connects the first capacitor to the connection and a detection signal when the first switch disconnects the first capacitor from the connection is not within a predetermined range.

21. The electrostatic capacitance sensor as set forth in claim 1, wherein
   the detection electrode includes a detection surface; and
   the shield electrode is disposed on an opposite of the detection electrode from the detection surface.

22. The electrostatic capacitance sensor as set forth in claim 11, wherein
   the detection electrode includes a detection surface; and
   the shield electrode is disposed on an opposite of the detection electrode from the detection surface.

* * * * *